(12) United States Patent
Miki

(10) Patent No.: US 10,485,098 B2
(45) Date of Patent: Nov. 19, 2019

(54) ELECTRONIC COMPONENT DEVICE

(71) Applicant: SHINKO ELECTRIC INDUSTRIES CO., LTD., Nagano-shi, Nagano (JP)

(72) Inventor: Shota Miki, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 15/184,380

(22) Filed: Jun. 16, 2016

(65) Prior Publication Data

US 2016/0374194 A1 Dec. 22, 2016

(30) Foreign Application Priority Data

Jun. 19, 2015 (JP) ................. 2015-124110

(51) Int. Cl.
| | |
|---|---|
| *H05K 1/02* | (2006.01) |
| *H05K 1/18* | (2006.01) |
| *H05K 1/11* | (2006.01) |

(52) U.S. Cl.
CPC ........... *H05K 1/0271* (2013.01); *H05K 1/185* (2013.01); *H05K 1/11* (2013.01); *H05K 1/111* (2013.01); *H05K 1/18* (2013.01); *H05K 2201/10674* (2013.01)

(58) Field of Classification Search
CPC .. H05K 1/0271; H05K 3/4614; H05K 3/3436; H05K 1/186; H05K 1/185; H05K 2201/10977; H05K 3/28; H05K 3/007; H05K 2201/10674; H05K 3/284; H05K 1/11; H05K 1/111; H05K 1/18; H01L 23/5383; H01L 24/00
See application file for complete search history.

(56) References Cited

U.S. PATENT DOCUMENTS

| | | | |
|---|---|---|---|
| 8,941,230 B2 * | 1/2015 | Kyozuka ................. | H01L 24/19 174/256 |
| 9,349,713 B2 * | 5/2016 | Kim ........................ | H01L 24/97 |

(Continued)

FOREIGN PATENT DOCUMENTS

| | | |
|---|---|---|
| JP | 2006-324568 | 11/2006 |
| JP | 2008-010885 | 1/2008 |

(Continued)

OTHER PUBLICATIONS

Japanese Office Action dated Aug. 14, 2018 with English translation, 4 pages.

*Primary Examiner* — Steven T Sawyer
*Assistant Examiner* — Paresh H Paghadal
(74) *Attorney, Agent, or Firm* — Rankin, Hill & Clark LLP

(57) ABSTRACT

An electronic component device includes: a wiring board including an insulating layer, and a plurality of pads exposed from the insulating layer; an electronic component module including: an insulating base material; an electronic component embedded in the insulating base material; and a plurality of connection terminals each connected to a corresponding one of the pads; and a sealing resin provided between the whole of a lower surface of the electronic component module id the wiring board. A content rate of filler contained in the sealing resin is higher than that of filler contained in the insulating layer and that of filler contained in the insulating base material.

4 Claims, 19 Drawing Sheets

(56) References Cited

U.S. PATENT DOCUMENTS

| | | | |
|---|---|---|---|
| 2003/0049411 A1* | 3/2003 | Chaudhuri | B32B 3/10 428/138 |
| 2003/0087538 A1* | 5/2003 | Ueno | H01L 23/5389 439/68 |
| 2004/0164385 A1* | 8/2004 | Kado | H01L 23/3128 257/678 |
| 2005/0133932 A1* | 6/2005 | Pohl | H01L 23/04 257/777 |
| 2005/0167849 A1* | 8/2005 | Sato | H01L 23/3121 257/778 |
| 2006/0261472 A1 | 11/2006 | Kimura et al. | |
| 2007/0056766 A1* | 3/2007 | Sunohara | H01L 23/5385 174/260 |
| 2008/0284001 A1* | 11/2008 | Mori | H01L 21/4853 257/712 |
| 2009/0008765 A1 | 1/2009 | Yamano et al. | |
| 2009/0239336 A1* | 9/2009 | Lee | H01L 21/6835 438/107 |
| 2009/0321921 A1* | 12/2009 | Hwang | H01L 23/13 257/701 |
| 2011/0084384 A1* | 4/2011 | Sakata | H01L 21/563 257/737 |
| 2011/0316148 A1* | 12/2011 | Kondo | H01L 21/4857 257/737 |
| 2012/0018194 A1* | 1/2012 | Maeda | H05K 3/0035 174/251 |
| 2012/0301825 A1* | 11/2012 | Yoshida | G03F 7/0047 430/270.1 |
| 2014/0063764 A1* | 3/2014 | Tanaka | H05K 1/185 361/764 |
| 2014/0063768 A1* | 3/2014 | Tanaka | H01L 23/3121 361/784 |
| 2014/0210109 A1 | 7/2014 | Tanaka et al. | |
| 2014/0301058 A1 | 10/2014 | Sunohara et al. | |
| 2015/0155214 A1* | 6/2015 | Lim | H01L 24/97 174/251 |
| 2015/0279818 A1* | 10/2015 | Hsu | H01L 24/19 257/737 |
| 2015/0279820 A1* | 10/2015 | Usami | H01L 25/0657 257/737 |
| 2016/0057863 A1* | 2/2016 | Kyozuka | H01L 21/486 361/764 |
| 2016/0255726 A1* | 9/2016 | Yoo | H01L 25/00 361/761 |
| 2016/0338195 A1* | 11/2016 | Ikeda | H05K 1/0298 |
| 2017/0077043 A1* | 3/2017 | Takemura | H01L 24/24 |

FOREIGN PATENT DOCUMENTS

| | | |
|---|---|---|
| JP | 2010-147153 | 7/2010 |
| JP | 2011-254047 | 12/2011 |
| JP | 2014-150154 | 8/2014 |
| JP | 2014-204005 | 10/2014 |

* cited by examiner

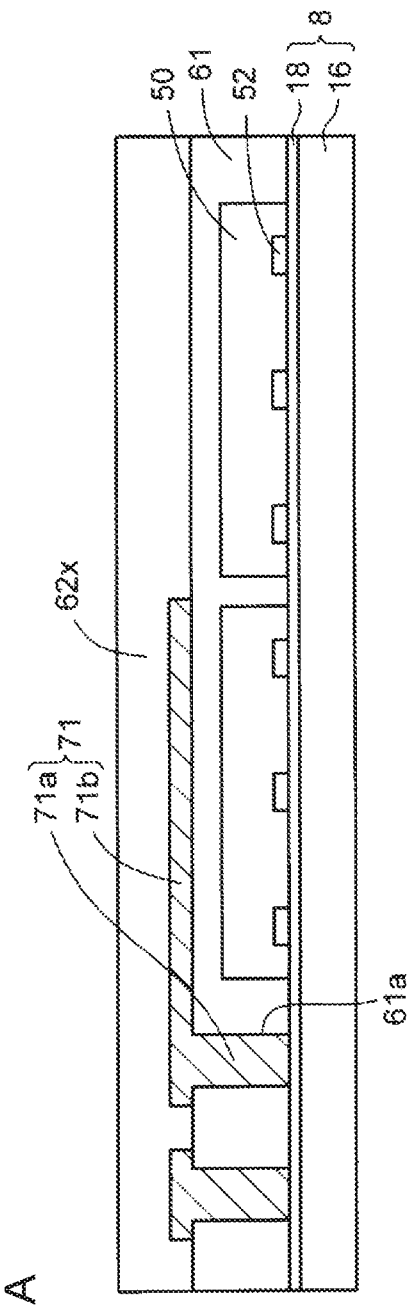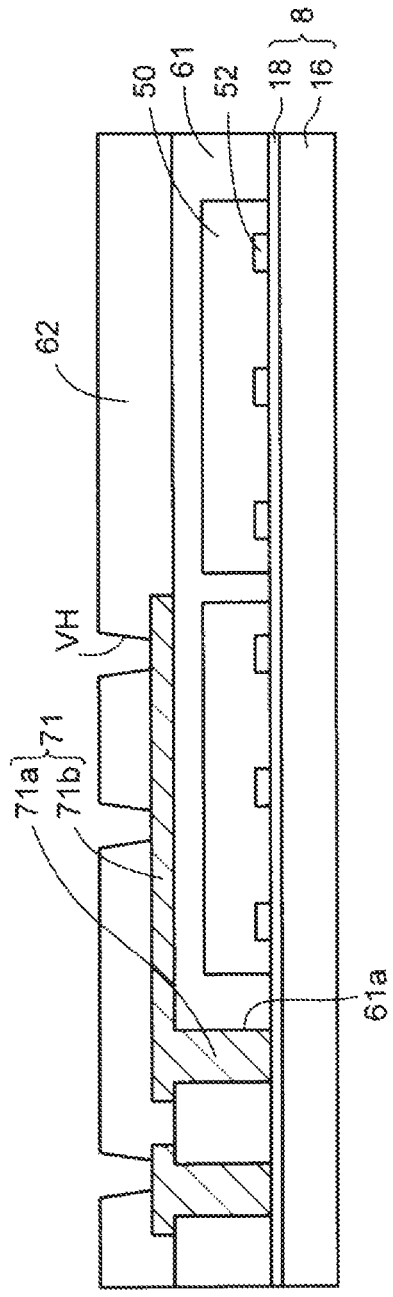

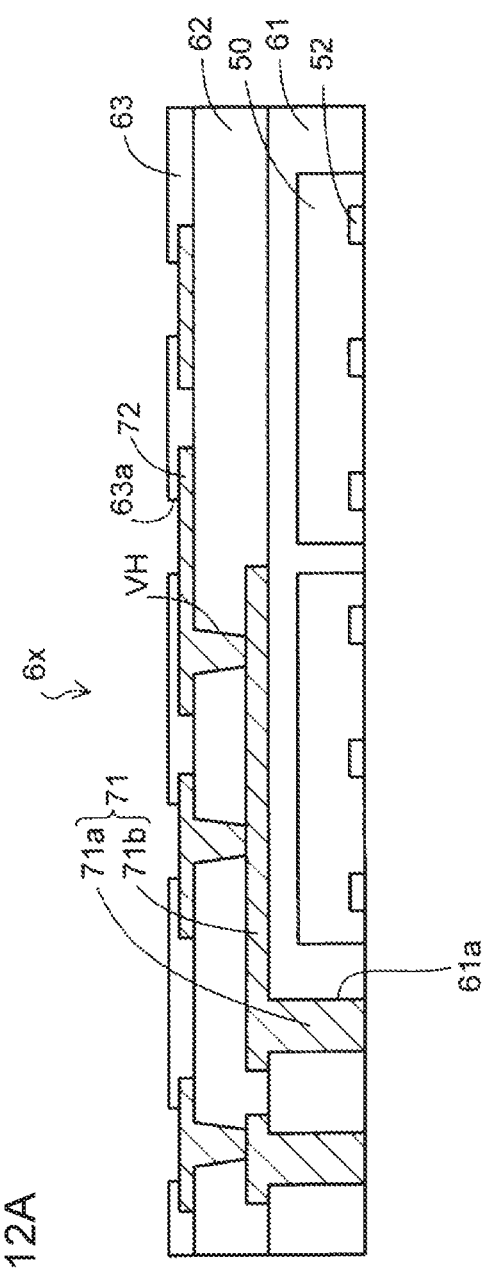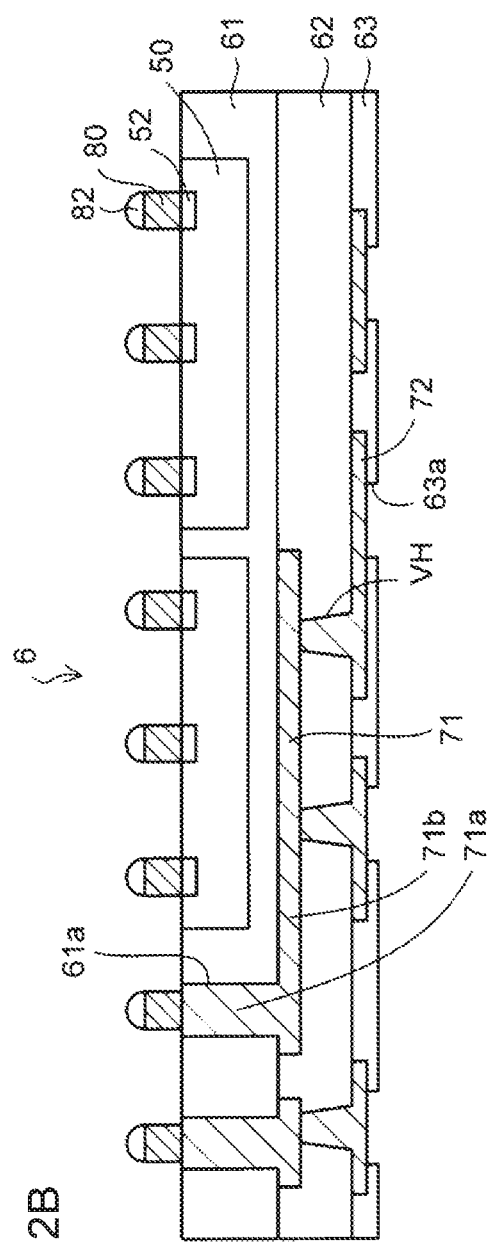

ELECTRONIC COMPONENT DEVICE

This application claims priority from Japanese Patent Application No. 2015-124110, filed on Jun. 19, 2015, the entire contents of which are herein incorporated by reference.

BACKGROUND

1. Technical Field

The present disclosure relates to an electronic component device.

2. Description of the Related Art

There are electronic component devices used in various electronic apparatuses. As an example of such an electronic component device, a semiconductor chip is flip-chip connected on a wiring board and sealed by an insulating layer (see e.g., JP-A-2010-147153).

As will be described in the following paragraphs about a preliminary matter, a method for manufacturing an electronic component device includes a step of forming an insulating layer to embed a semiconductor chip in the insulating layer after the semiconductor chip is flip-chip connected on a wiring board.

In the step of forming the insulating layer, the whole of the wiring board is subjected to heat treatment in a state in which the wiring board is vertically asymmetric with respect to a core substrate. Therefore, warping may occur in the wiring board due to thermal stress so that sufficient reliability in connection of the semiconductor chip cannot be obtained.

SUMMARY

According to one or more aspects of the present disclosure, there is provided an electronic component device. The electronic component device includes: a wiring board including an insulating layer, and a plurality of pads exposed from the insulating layer; an electronic component module including: an insulating base material; an electronic component embedded in the insulating base material; and a plurality of connection terminals each connected to a corresponding one of the pads; and a sealing resin provided between the whole of a lower surface of the electronic component module and the wiring board. A content rate of filler contained in the sealing resin is higher than that of filler contained in the insulating layer and that of filler contained in the insulating base material.

According to the present disclosure, there is provided an electronic component device in which occurrence of warping in a wiring board can be prevented.

BRIEF DESCRIPTION OF THE DRAWINGS

FIGS. 10A and 10B are sectional views (part 4) showing the method for manufacturing the electronic component device according to the first embodiment;

FIGS. 124 and 12B are sectional views (part 6) showing the method for manufacturing the electronic component device according to the first embodiment;

DETAILED DESCRIPTION

Embodiments will be described below respectively with reference to the accompanying drawings. Incidentally, a characteristic part is enlarged and shown in some accompanying drawings for convenience's sake in order to make it easy to understand that characteristic, and the dimensional ratios etc. of respective constituent elements do not always agree with real ones. In addition, hatching of a part of members is omitted in each sectional view in order to make it easy to understand the sectional structure of each member.

Prior to description of the embodiments, a preliminary matter underlying the embodiments will be described. FIGS. 1 to 6 are views for explaining problems of a method for manufacturing an electronic component device according to the preliminary matter. The method for manufacturing the electronic component device according to the preliminary matter contains the details of personal study of the present inventor rather than known techniques.

Figure 1:
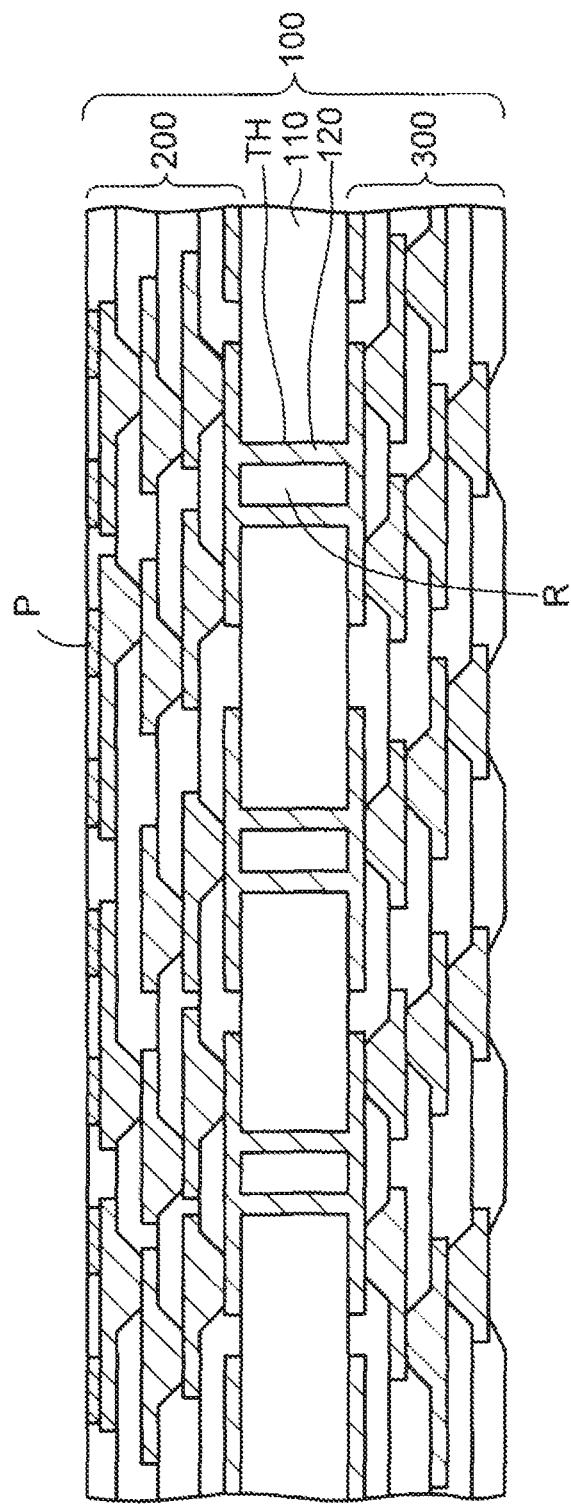
FIG. 1 is a sectional view (part 1) showing a method for manufacturing an electronic component device according to a preliminary matter.

According to the method for manufacturing the electronic component device according to the preliminary matter, first, a wiring board 100 shown in FIG. 1 is prepared. The wiring board 100 has a core substrate 110 in its thickness-direction central portion. An upper multilayer wiring layer 200 having a four-layer structure is formed on an upper surface side of the core substrate 110. Pads P of the upper multilayer wiring layer 200 are disposed in the top.

In addition, a lower multilayer wiring layer 300 having a four-layer structure is formed on a lower surface side of the core substrate 110. Through holes TH are formed in the core substrate 110. A through hole plating layer 120 is formed in each of side walls of the through holes TH. The remaining openings of the through holes TH are filled with resin bodies R.

The upper multilayer wiring layer 200 and the lower multiplayer wiring layer 300 are connected to each other through the through hole plating layer 120.

Figure 2:
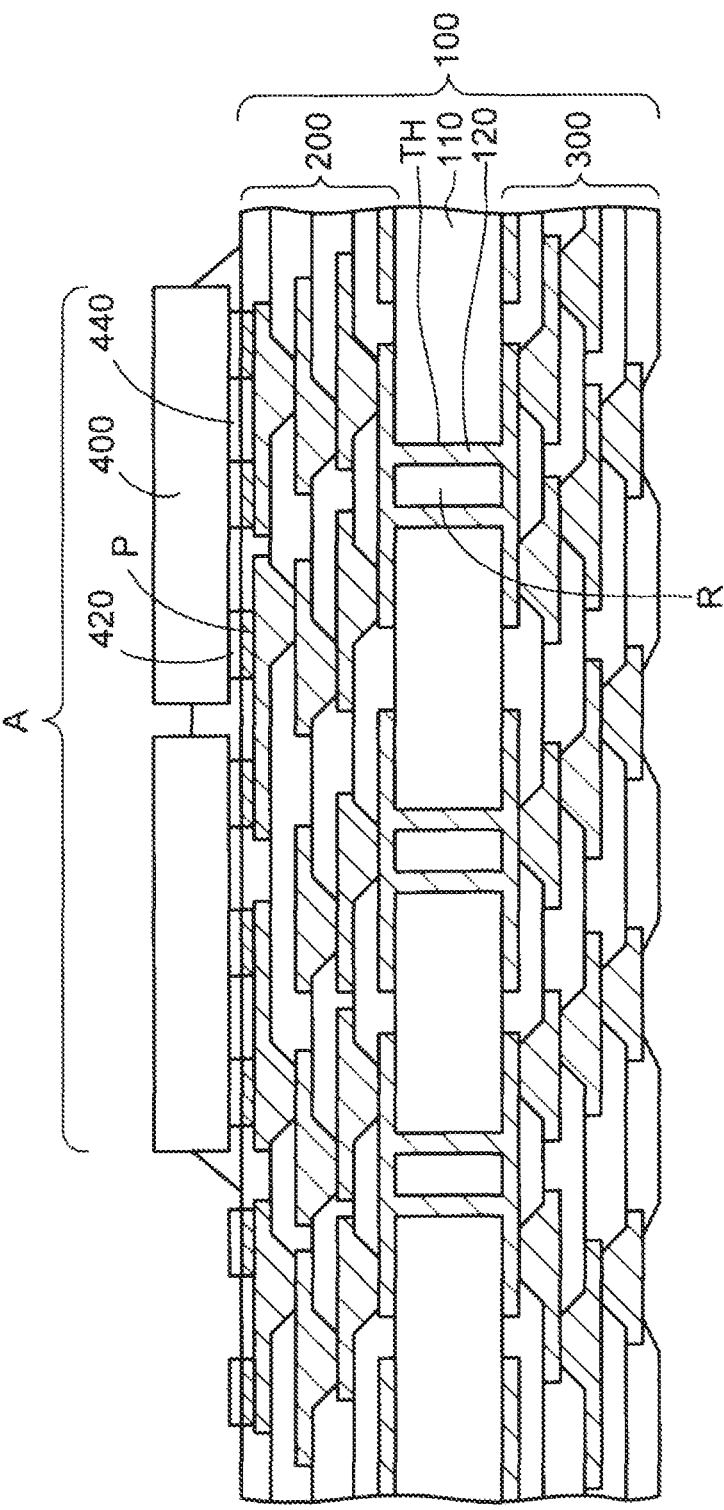
FIG. 2 is a sectional view (part 2) showing the method for manufacturing the electronic component device according to the preliminary matter.

Next, as shown in FIG. 2, two semiconductor chips 400 are prepared. Each semiconductor chip 400 has terminals 420 in its lower surface. The terminals 420 of the semiconductor chip 400 are flip-chip connected to the pads P of the wiring board 100 through solders (not shown).

Thus, the two semiconductor chips 400 are mounted to be arranged side by side horizontally. Then, an underfill resin 440 is filled on the lower sides of the semiconductor chips 400.

The wiring board 100 is a large-sized board for obtaining multiple boards. A plurality of component mounting regions A are defined in the wiring board 100. In FIG. 2, one component mounting region A is partially shown.

Successively, after a photosensitive resin film (not shown) is pasted on the wiring board 100 and the semiconductor chips 400 and exposed and developed based on photolithography, the photosensitive resin film is subjected to heat treatment at a temperature of 150° C. to 200° C. so as to be cured.

Figure 3:
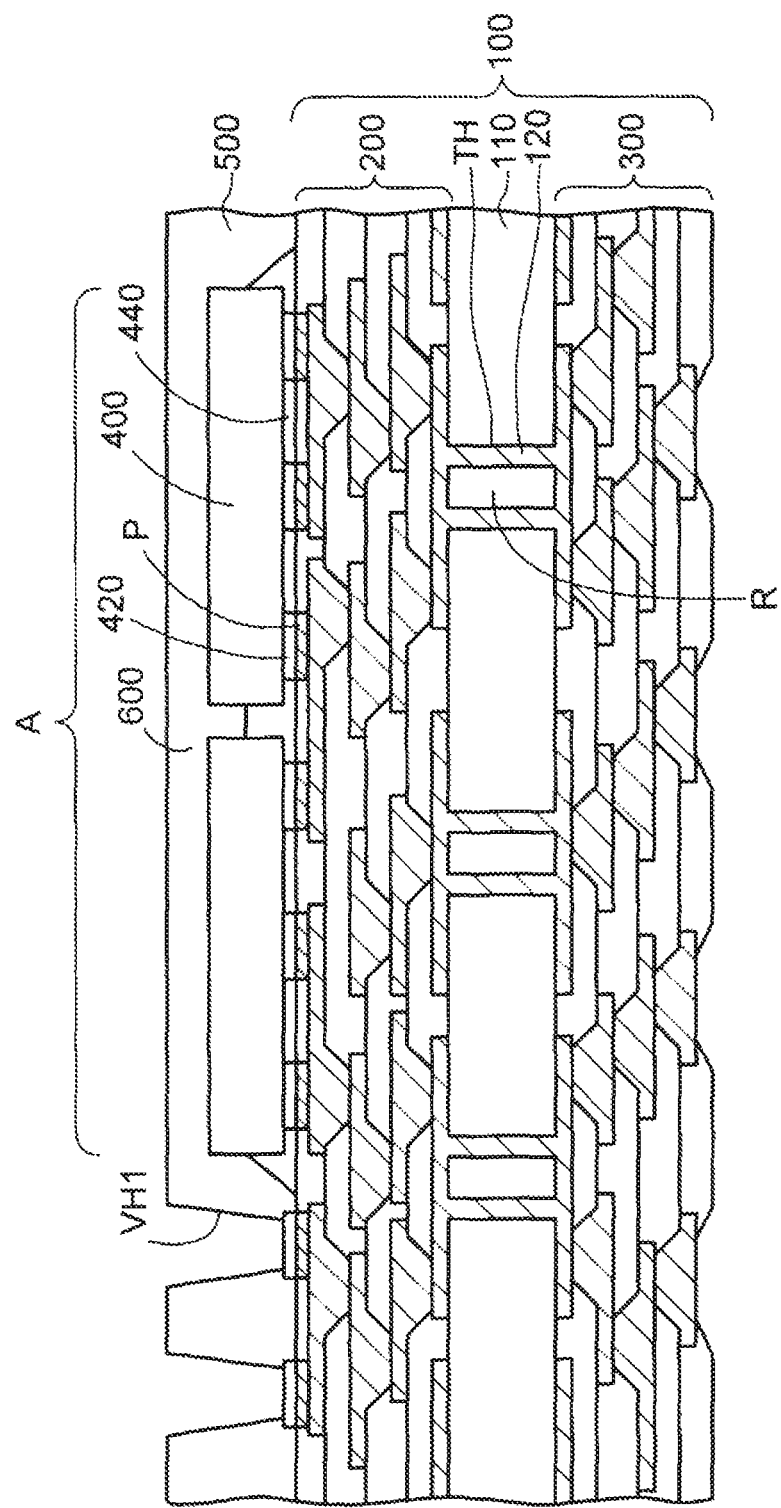
FIG. 3 is a sectional view (part 3) showing the method for manufacturing the electronic component device according to the preliminary matter.

Thus, as shown in FIG. 3, a first insulating layer 500 having first via holes VH1 on the pads P of the wiring board 100 disposed in the horizontal direction of the semiconductor chips 400 is formed. The two semiconductor chips 400 are embedded in the first insulating layer 500.

The first insulating layer 500 is formed into a blanket shape on the whole of the upper surface side of the large-sized wiring board 100 including the plurality of component mounting regions A.

On this occasion, the first insulating layer 500 is formed only on the upper surface side of the wiring board 100. Accordingly, the first insulating layer 500 has a vertically asymmetric structure with respect to the core substrate 110. In this state, the wiring board 100 and the semiconductor chips 400 as a whole are heated. Therefore, thermal stress occurs based on a difference in the coefficient of thermal Expansion between the semiconductor chips 400 (silicone) and the wiring board 100.

Therefore, there is a problem that warping occurs in the wiring board 100 due to the influence of thermal stress.

When warping occurs in the wiring board 100, connection failure between the wiring board 100 and the semiconductor chips 400 occurs easily, to thereby lower the manufacturing yield.

In addition, in order to suppress occurrence of the warping in the wiring board 100 as much as possible, it is necessary to limit the material of the first insulating layer 500 to a material capable of preventing warping from occurring easily. For example, the coefficient of thermal expansion of the first insulating layer 500 may be adjusted. Accordingly, the degree of freedom for selecting the material of the first insulating layer 500 becomes narrow.

Therefore, there remains another problem that properties such as electric insulation properties of the first insulating layer 500 may be far from satisfactory to obtain sufficient reliability in multilayer wiring, or the manufacturing cost may increase.

Figure 4:
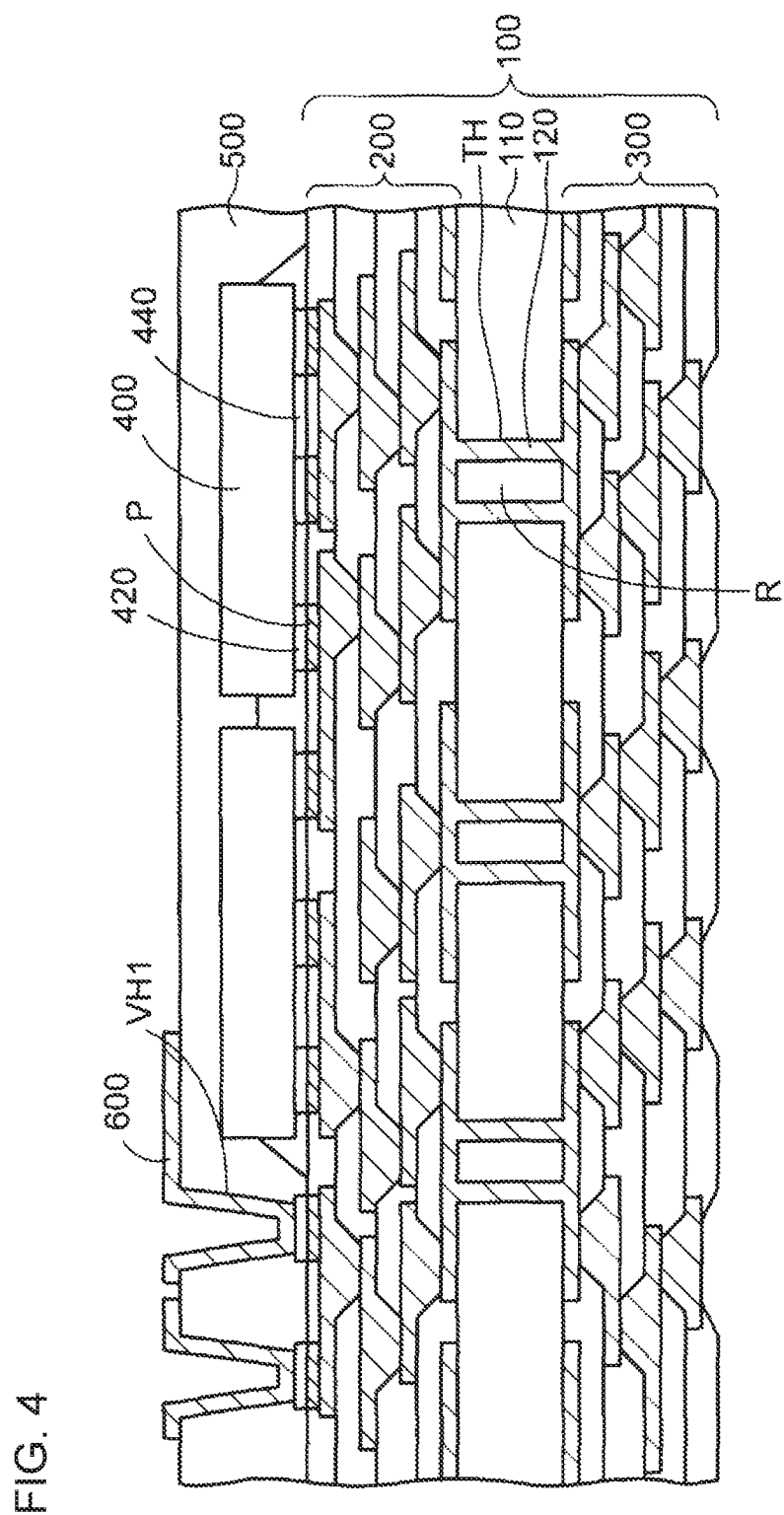
FIG. 4 is a sectional view (part 4) showing the method for manufacturing the electronic component device according to the preliminary matter.

Next, as shown in FIG. 4, a first rewiring layer 600 is formed on the first insulating layer 500 so that the first rewiring layer 600 can be connected to the pads P of the wiring board 100 through a plating layer of side walls of the first via holes VH1.

Figure 5:
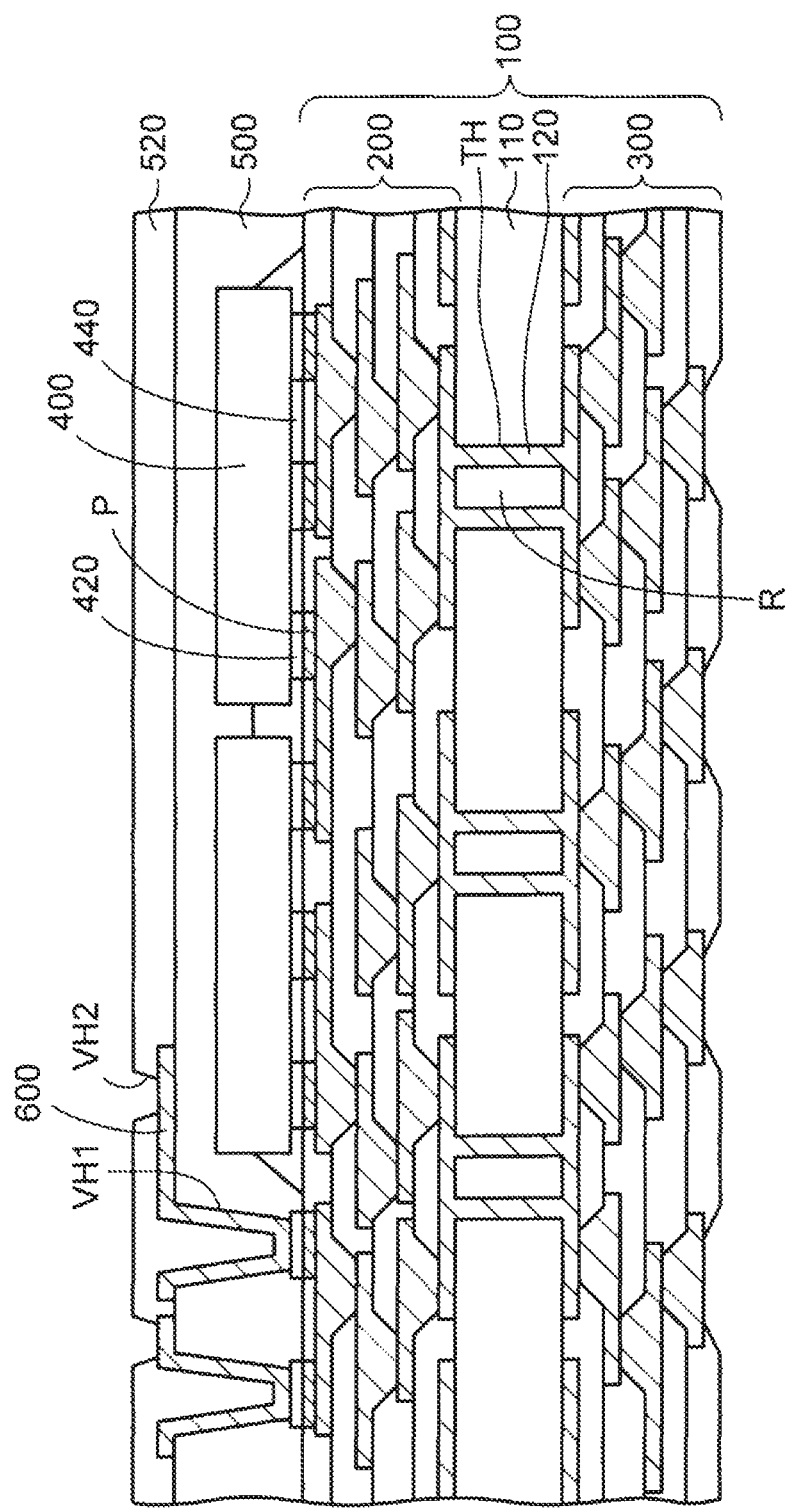
FIG. 5 is a sectional view (part 5) showing the method for manufacturing the electronic component device according to the preliminary matter.

Successively, as shown in FIG. 5, a second insulating layer 520 having second via holes VH2 on connection portions of the first rewiring layer 600 is formed by a similar method to the aforementioned method for forming the first insulating layer 500 in FIG. 3. Also when the second insulating layer 520 is formed, the second insulating layer 520 which is vertically asymmetric with respect to the core substrate 110 is subjected to heat treatment to thereby further cause occurrence of warping in the wiring board 100.

Figure 6:
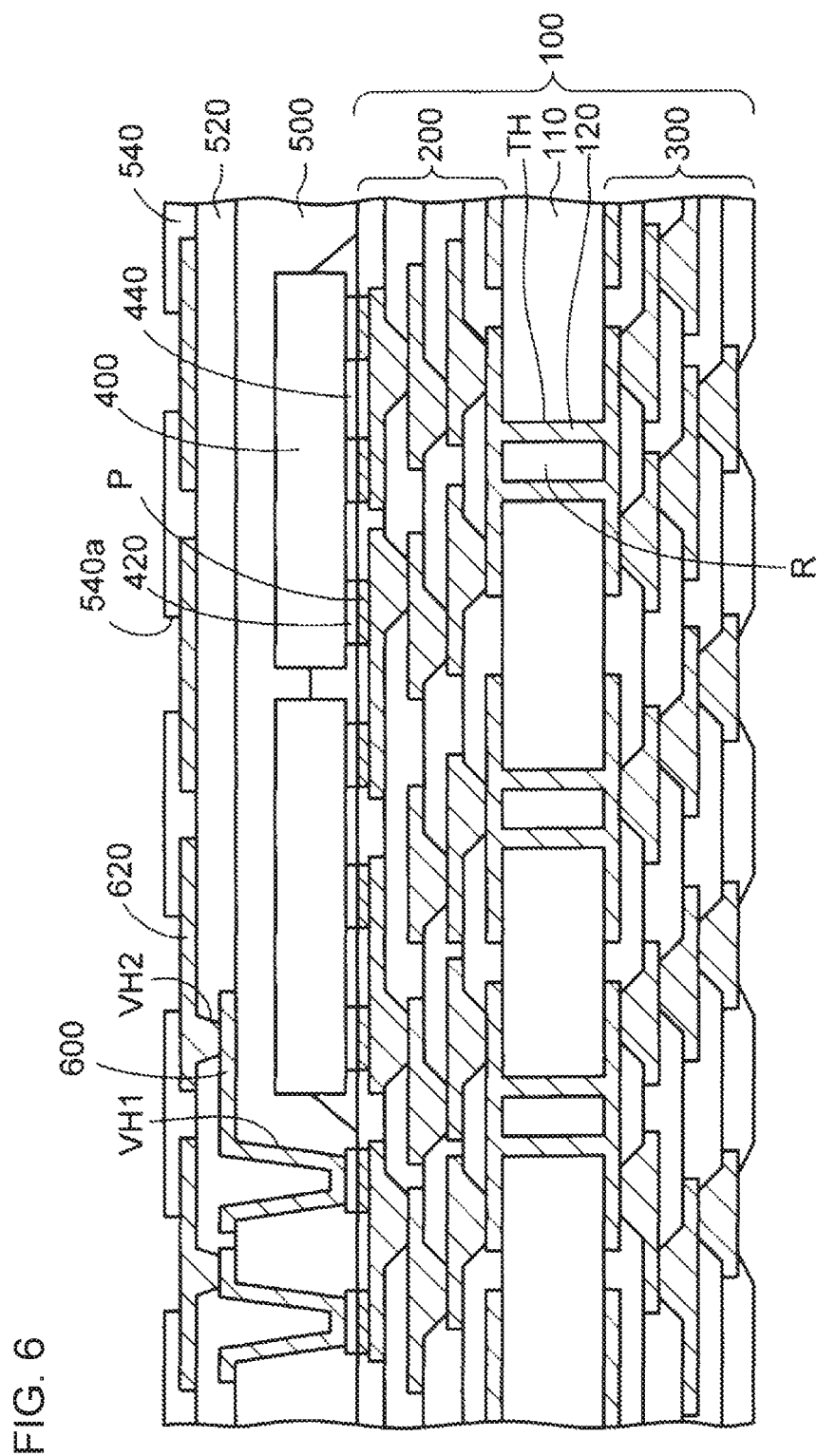
FIG. 6 is a sectional view (part 6) showing the method for manufacturing the electronic component device according to the preliminary matter.

Next, as shown in FIG. 6, a second rewiring layer 620 is formed on the second insulating layer 520 so that the second rewiring layer 620 can be connected to the first rewiring layer 600 through via conductors inside the second via holes VH2. Further, a solder resist layer 540 which has opening portions 540a on connection portions of the second rewiring layer 620 is formed.

When the first insulating layer 500 is formed to embed the semiconductor chips 400 therein according to the method for manufacturing the electronic component device according to the preliminary matter as described above, there is a problem that warping may occur easily in the wiring board 100 to thereby lower the manufacturing yield.

According to an electronic component device and a method for manufacturing the electronic component device according to an embodiment which will be described below, the aforementioned problems can be solved.

First Embodiment

FIG. 7, FIGS. 8A to 8C, FIGS. 9A and 9B, FIGS. 10A and 10B, FIGS. 11A and 11B, FIGS. 12A and 12B, FIG. 13 and FIG. 14 are views showing the method for manufacturing the electronic component device according to a first embodiment. FIG. 15 is a view showing the electronic component device according to the first embodiment.

The structure of the electronic component device will be described below while the method for manufacturing the electronic component device is described.

Figure 7:
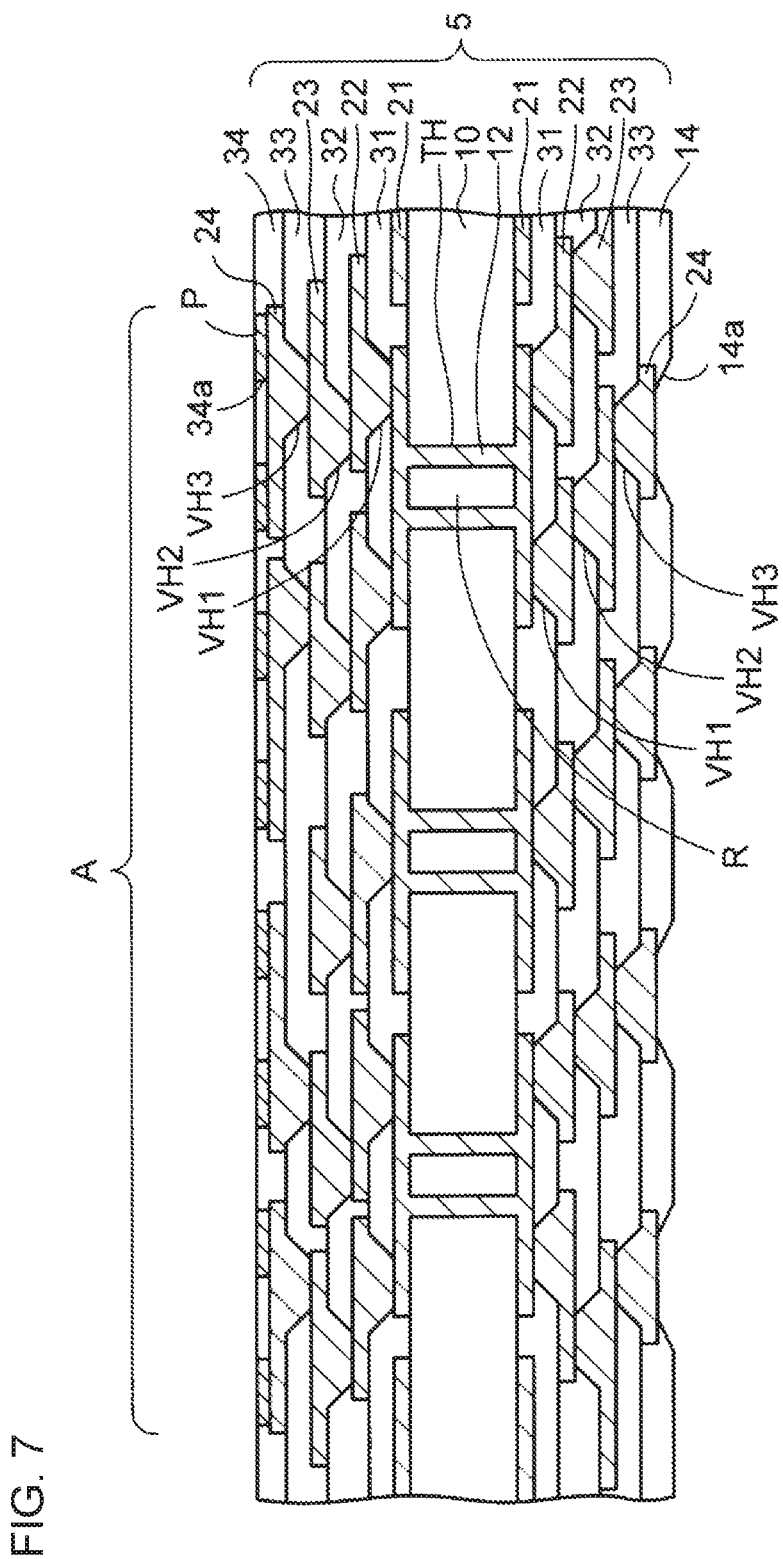
FIG. 7 is a sectional view (part 1) showing a method for manufacturing an electronic component device according to a first embodiment.

In the method for manufacturing the electronic component device according to the first embodiment, first, a wiring board 5 of a multilayer structure used in the electronic component device is prepared, as shown in FIG. 7. The wiring board 5 has a core substrate 10 in its thickness-direction central portion. Through holes are formed in the core substrate 10 to penetrate the core substrate 10 in the thickness direction. A through hole plating layer 12 is formed in an inner wall of each of the through holes TR. The remaining opening of the through hole TH is filled with a resin body R. The core substrate 10 is made of an insulating material such as a glass epoxy resin.

In addition, first wiring layers 21 are formed on opposite surface sides of the core substrate 10 respectively. The first wiring layers 21 on the opposite surface sides are connected to each other through the through hole plating layer 12.

The through holes TH of the core substrate 10 are formed by a drill etc. In addition, the through hole plating layer 12 formed in the core substrate 10 and the first wiring layers 21 are formed by a plating method and photolithography etc.

In addition, first insulating layers 31 in which first via holes VH1 are disposed on connection portions of the first wiring layers 21 are formed on the opposite surface sides of the core substrate 10 respectively. The first insulating layers 31 are made of an insulating resin such as an epoxy resin or a polyimide resin. The first via holes VH1 are formed by a laser.

Further, second wiring layers 22 are formed on the first insulating layers 31 on the opposite surface sides respectively so that the second wiring layers 22 can be connected to the first wiring layers 21 through via conductors inside the first via holes VH1. In addition, second insulating layers 32 in which second via holes VH2 are disposed on connection portions of the second wiring layer 22 are formed on the first insulating layers 31 on the opposite surface sides respectively.

Similarly, third wiring layers 23 are formed on the second insulating layers 32 on the opposite surface sides respectively so that the third wiring layers 23 can be connected to the second wiring layers 22 through via conductors inside the second via holes VH2.

Further similarly, third insulating layers 33 in which third via holes VH3 are disposed on connection is of the third wiring layers 23 are formed on the second insulating layers 32 on the opposite surface sides respectively.

Similarly, fourth wiring layers 24 are formed on the third insulating layers 33 on the opposite surface sides respectively so that the fourth wiring layers 24 can be connected to the third wiring layers 23 through via conductors inside the third via holes VH3.

A solder resist layer 14 in which opening portions 14a are provided on connection portions of the fourth wiring layer 24 is formed on the third insulating layer 33 on the lower surface side of the core substrate 10.

In addition, a fourth insulating layer 34 in which opening portions 34a are provided on connection portions of the fourth wiring layer 24 is formed on the third insulating layer 33 on the upper surface side of the core substrate 10. Pads P are formed in the opening portions 34a of the fourth insulating layer 34.

Thus, the wiring board 5 of the multilayer structure which includes the insulating layer and the pads exposed from the insulating layer is prepared. In the example of FIG. 7, the multiple wiring layer of the four-layer structure is formed on each of the opposite surface sides of the core substrate 10. However, the number of layers disposed in the multilayer wiring layer may be set arbitrarily.

In addition, a coreless type wiring board having no core substrate may be used. The coreless type wiring board can be manufactured in such a manner that a multiple wiring layer is formed releasably on a temporary substrate, and then, the temporary substrate is released.

The wiring board 5 according to the embodiment is a large-sized board for obtaining multiple boards. A plurality of component mounting regions A are defined on the wiring board 5. In FIG. 7, one component mounting region A of the wiring board 5 is partially shown.

Next, a method for manufacturing an electronic component module to be connected to the pads P of the wiring board 5 in FIG. 7 will be described. An electronic component device is constructed by connecting the electronic component module to the wiring board 5 in FIG. 7.

Figure 8A:
FIGS. 8A to 8C are sectional views (part 2) showing the method for manufacturing the electronic component device according to the first embodiment.

As shown in FIG. 8A, first, a support plate 8 functioning as a temporary substrate is prepared. The support plate 8 is formed to include a base material 16 and an adhesive tape 18 bonded on the base material 16. A metal foil made of copper etc., a PET film, or a glass epoxy resin substrate etc. is used as the base material 16.

Figure 8B:
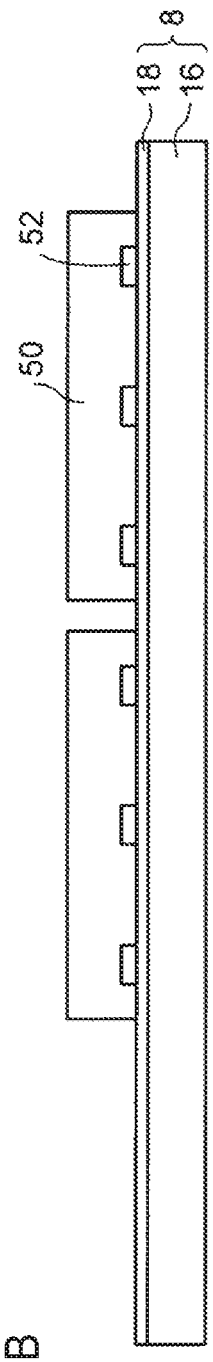

Next, as shown in FIG. 8B, two semiconductor chips 50 are prepared. Electrodes 52 are provided in one surface of each semiconductor chip 50. The semiconductor chip 50 is made thin to be 100 μm to 50 μm in thickness. In the state in which the electrodes 52 of the semiconductor chip 50 are faced down, the semiconductor chip 50 is temporarily bonded to the adhesive tape 18 of the support plate 8.

The two semiconductor chips 50 are mounted to be arranged side by side in the horizontal direction. The two semiconductor chips 50 are, for example, a logic IC and a memory IC.

Figure 8C:
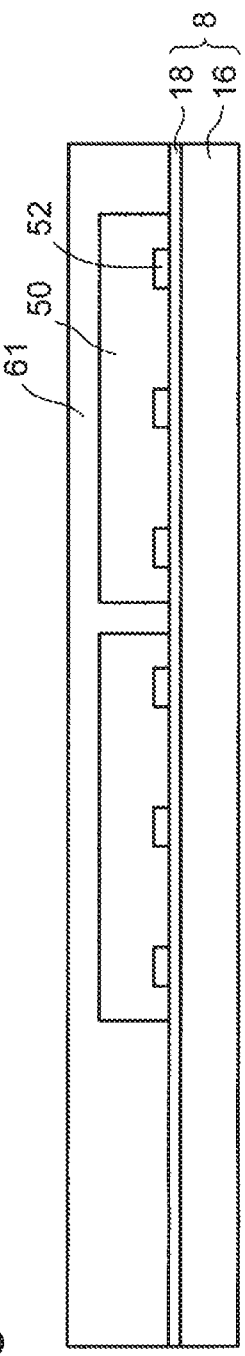

Successively, as shown in FIG. 8C, a non-photosensitive resin film is pasted on the support plate 8 and the semiconductor chips 50 and subjected to heat treatment. Thus, a first insulating layer 61 is formed. The first insulating layer 61 is made of an insulating resin such as an epoxy resin or a polyimide resin.

When each semiconductor chip 50 is 100 μm thick, the thickness of the first insulating layer 61 is set at about 200 μm so that the semiconductor chip 50 can be embedded in the first insulating layer 61. The first insulating layer 61 is formed to be flat all over its upper surface.

Figure 9A:
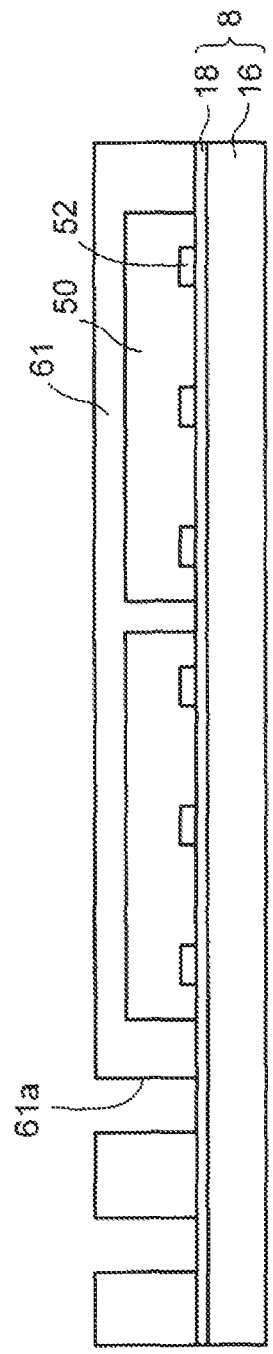
FIGS. 9A and 9B are sectional views (part 3) showing the method for manufacturing the electronic component device according to the first embodiment.

Successively, as shown in FIG. 9A, when the first insulating layer 61 is processed by a laser, opening portions 61a are formed. The opening portions 61a of the first insulating layer 61 are disposed in a region outside the semiconductor chips 50. The diameter of each opening portion 61a of the first insulating layer 61 is, for example, about 100 μm.

Further, when the inside of the opening portion 61a of the first insulating layer 61 is dismeared by a permanganate method etc., resin smears are removed and cleaned.

Assume that extremely thin type semiconductor chips 50 each of which is not more than about 50 μm thick are used so that the film thickness of the first insulating film 61 can be reduced. In this case, a photosensitive resin may be used and exposed and developed based on photolithography to thereby form the first insulating film 61 provided with the opening portions 61a.

The first insulating film 61 in which the semiconductor chips 50 according to the embodiment are et bedded corresponds to the first insulating layer 500 in which the semiconductor chips 400 in FIG. 3 according to the aforementioned preliminary matter are embedded. In the embodiment, by heat treatment, the first insulating layer 61 is formed on the semiconductor chips 50 temporarily bonded to the support plate 8.

Thus, differently from the preliminary matter, the first insulating layer 61 is not formed directly on the wiring board 5 in FIG. 7. Accordingly, occurrence of warping in the wiring board 5 can be avoided. In addition, since it is not necessary to consider occurrence of warping in the wiring board 5, the degree of freedom for selecting the resin material of the first insulating layer 61 can be widened.

Accordingly, since the first insulating layer 61 suitable for properties of multilayer wiring can be used, sufficient reliability can be obtained and cost reduction can be also achieved.

Figure 9B:
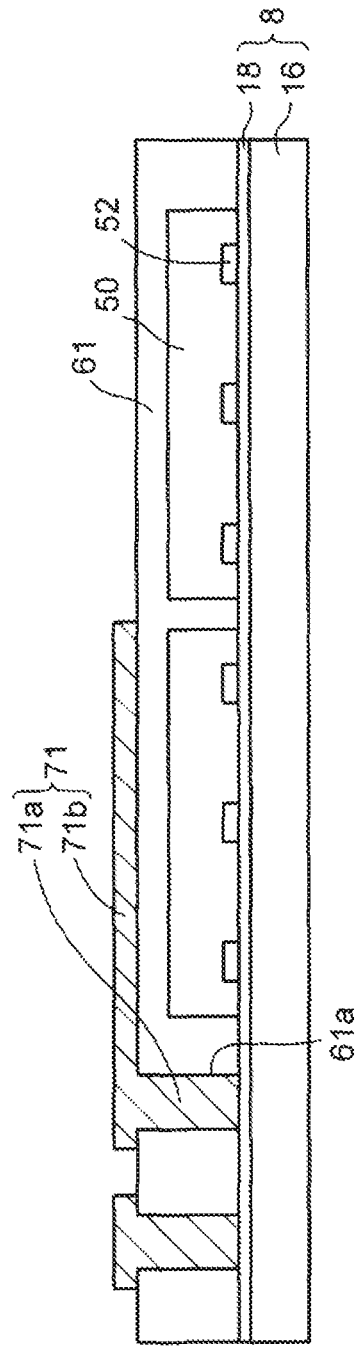

Next, as shown in FIG. 9B, a first wiring layer 71 is formed on the first insulating layer 61 from the opening portions 61a of the first insulating layer 61. The first wiring layer 71 is formed to include columnar conductors 71a and wiring portions 71b. Each columnar conductor 71a is embedded in the corresponding opening portion 61a of the first insulating layer 61, The wiring portions 71b are disposed on the first insulating layer 61 to link with the columnar conductors 71a respectively. The thickness of the first wiring layer 71 is, for example, 10 μm to 30 μm.

The first wiring layer 71 is formed, for example, by a semi-additive method. More specifically, a seed layer (not shown) made of copper etc. is formed on the first insulating layer 61 and inside the opening portions 61a by an electroless plating method or a sputtering method.

Successively, a plating resist layer (not shown) in which an opening portion is provided in a portion where the first wiring layer 71 should be disposed is formed on the seed layer.

Further, after a metal plating layer (not shown) made of copper etc is formed in the opening portion of the plating resist layer by electrolytic plating using the seed layer as a plating power feed passage, the plating resist layer is removed.

Then, the seed layer is removed by wet etching using the metal plating layer as a mask.

In the aforementioned manner, the first wiring layer 71 made up of seed layer and the metal plating layer can be obtained.

Next, as shown in FIG. 10A, a photosensitive resin layer 62x is formed on the first insulating layer 61 and the first wiring layer 71 and exposed and developed based on photolithography. Thus, as shown in FIG. 10B, a second insulating layer 62 in which via holes VH are disposed on connection portions of the first wiring layer 71 is formed. The photosensitive resin layer may be formed by pasting a resin film of an epoxy resin, a polyimide resin, etc. or by applying a liquid resin of an epoxy resin, a polyimide resin, etc.

For example, the thickness of the second insulating layer 62 is 10 μm to 30 μm. The diameter of each via hole VH is about 30 μm.

Figure 11A:
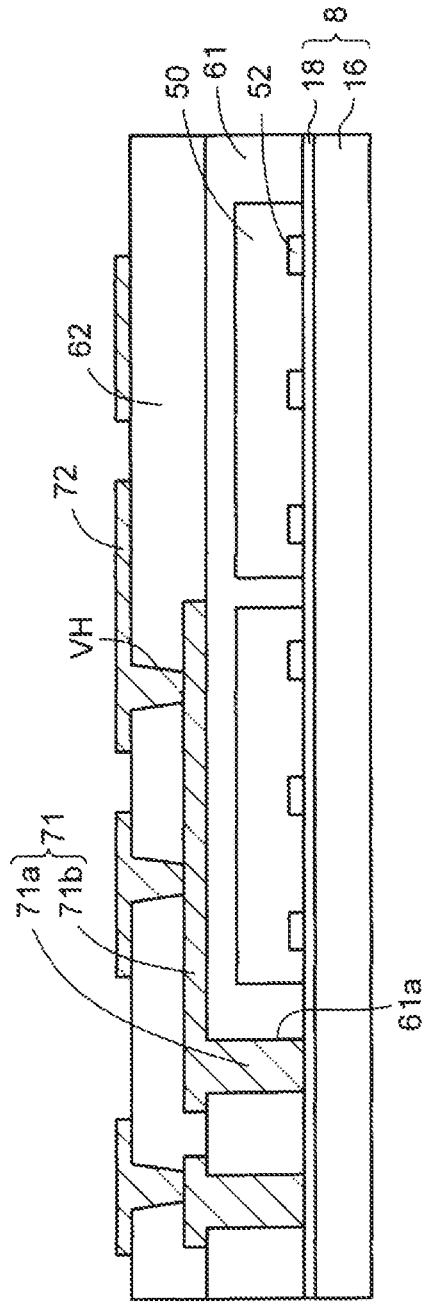
FIGS. 11A and 11B are sectional views (part 5) showing the method for manufacturing the electronic component device according to the first embodiment.

Successively, as shown in FIG. 11A, a second wiring layer 72 is formed on the second insulating layer 62 by a similar method to the aforementioned method for forming the first wiring layer 71 in FIG. 9B so that the second wiring layer 72 can be connected to the first wiring layer 71 through via conductors in the via holes VH. The thickness of the second wiring layer 72 is, for example, 5 μm to 10 μm.

Figure 11B:
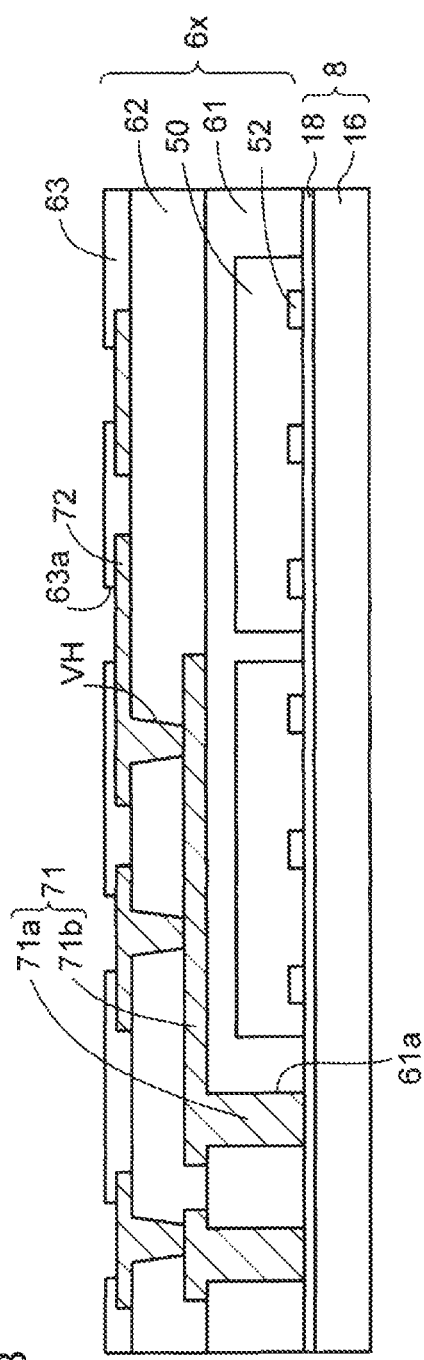

Then, as shown in FIG. 11B, a solder resist layer 63 in which opening portions 63 are provided on connection portions of the second wiring layer 72 is formed. In this manner, an electronic member 6x is formed on the support plate 8.

Successively, when the support plate 8 is released from an interface between the adhesive tape 18 and the electronic member 6x, the support plate 8 is separated and removed from the electronic member 6x, as shown in FIG. 12A. In this manner, lower surfaces of the electrodes 52 of the semiconductor chips 50, the columnar conductors 71a of the first wiring layer 71, and the first insulating layer 61 are exposed in a lower surface of the electronic member 6x.

Next, the electronic member 6x in FIG. 12A is turned upside down as shown in FIG. 12B. Further, connection terminals 80 and solders 82 are formed on the electrodes 52 of the semiconductor chips 50 and the columnar conductors 71a of the first wiring layer 71.

The connection terminals 80 and the solders 82 are formed, for example, by a semi-additive method. More specifically, a seed layer (not shown) made of copper etc. is formed on the semiconductor chips 50, the columnar conductors 71a of the first wiring layer 71 and the first insulating layer 61 by an electroless plating method or a sputtering method.

Successively, a plating resist layer (not shown) in which hole-like opening portions are provided in portions where the connection terminals 80 should be disposed is formed on the seed layer.

Further, after the connection terminals 80 and the solders 82 made of metal posts of copper etc. are formed in the opening portions of the plating resist layer by electrolytic plating using the seed layer as a plating power feed passage, the plating resist layer is removed.

Then, the seed layer is removed by wet etching using the connection terminals 80 and the solders 82 as a mask.

In this manner, the connection terminals 80 and the solders 82 made up of the seed layer and the metal posts can be obtained. The diameter of each connection terminal 80 is 20 μm to 30 μm. The height of the connection terminal 80 excluding the solder 82 is 20 μm to 40 μm.

Figure 13:
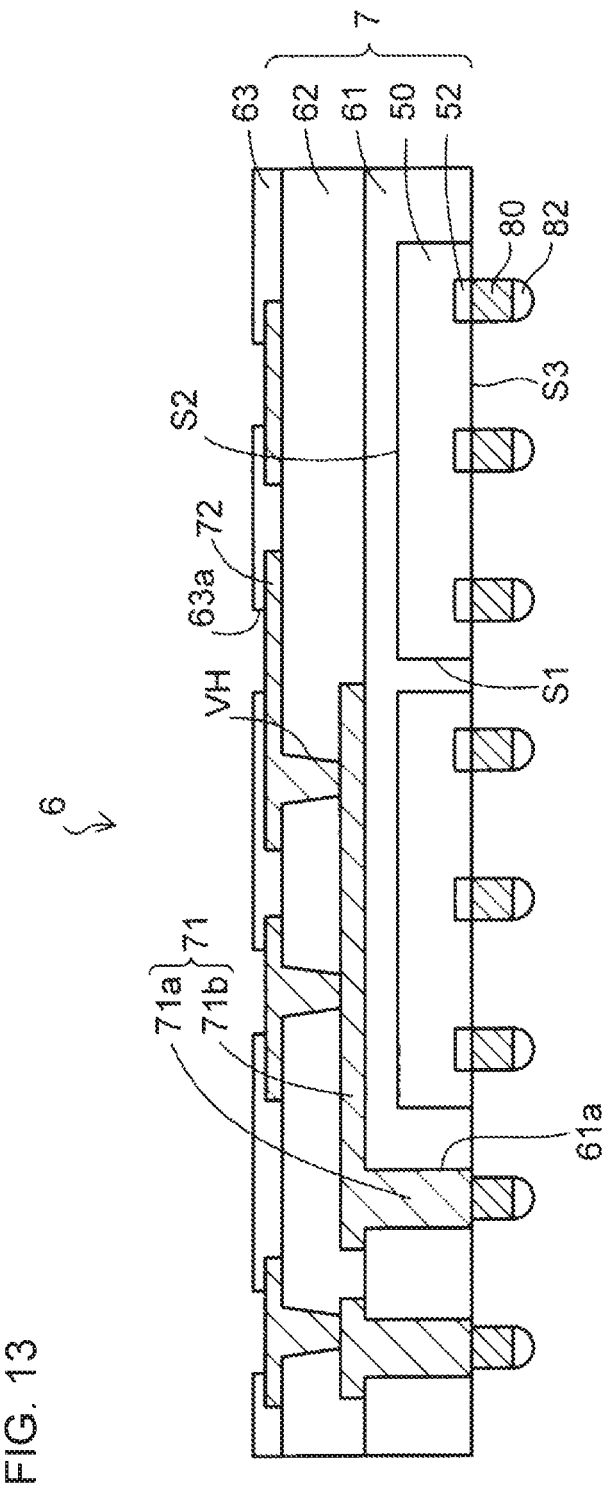
FIG. 13 is a sectional view (part 7) showing the method for manufacturing the electronic component device according to the first embodiment.

In the aforementioned manner, an electronic component module 6 according to the first embodiment is manufactured, as shown in FIG. 12B. FIG. 13 shows a state in which the electronic component module 6 in FIG. 12B has been turned upside down.

As shown in FIG. 13, an insulating base material 7 in the electronic component module 6 used in the electronic component device according to the first embodiment is formed to include the first insulating layer 61 and a second insulating layer 62 disposed thereon. The two semiconductor chips 50 are embedded in the first insulating layer 61 of the insulating base material 7. In the state in which the electrodes 52 of the semiconductor chips 50 are faced down, the two semiconductor chips 50 are disposed to be arranged side by side horizontally.

In addition, each semiconductor chip 50 has a side surface S1, a back surface S2, and an element forming surface S3. The side surface S1 and the back surface 82 are embedded in the first insulating layer 61. The element forming surface S3 in which the electrodes 52 are disposed is exposed from the first insulating layer 61.

The opening portions 61a are formed in the first insulating layer 61 in the region outside the semiconductor chips 50 so as to penetrate the first insulating layer 61 from the upper surface to the lower surface. The first wiring layer 71 is formed on the upper surface of the first insulating layer 61 from the opening portions 61a of the first insulating layer 61.

The first wiring layer 71 is formed to include the columnar conductors 71a and the wiring portions 71b. The columnar conductors 71a are embedded in the opening portions 61a of the first insulating layer 61 respectively. The wiring portions 71b extend to the upper surface of the first insulating layer 61 to link with the columnar conductors 71a.

The second insulating layer 62 in which the via holes VH are disposed on the connection portions of the first wiring layer 71 is formed on the first insulating layer 61. In addition, the second wiring layer 72 is formed on the second insulating layer 62 so that the second wiring layer 72 can be connected to the first wiring layer 71 through the via conductors inside the via holes VH.

Further, the solder resist layer 63 in which the opening portions 63a are provided on the connection portions of the second layer 72 is formed on the second insulating layer 62.

When attention is paid to the lower surface side of the insulating base material 7, the lower surface of the first insulating layer 61, the lower surfaces (element forming surfaces S3) of the semiconductor chips 50, and the lower surfaces of the columnar conductors 71a of the first wiring layer 71 are disposed at the same height position so that all the lower surfaces are flush with one another.

This is because the semiconductor chips 50, the first insulating layer 61 and the columnar conductors 71*a* of the first wiring layer 71 are disposed on the same surface of the support plate 8 and the support plate 8 is removed finally, as described in the aforementioned manufacturing method.

Further, the columnar connection terminals 80 are formed on the lower surfaces of the electrodes 52 of the semiconductor chips 50 and the columnar conductors 71*a* of the first wiring layer 71, and the solders 82 are provided at front ends of the connection terminals 80.

In the aforementioned manner, the aforementioned wiring board 5 in FIG. 7 and the electronic component module 6 in FIG. 13 are prepared.

In the aforementioned preliminary matter, the semiconductor Chips are mounted on the wiring board, and the insulating layer is formed on the whole surface of the wiring board so that the semiconductor chips can be embedded in the insulating layer. On the other hand, according to the embodiment, the wiring board 5 and the electronic component module 6 can be manufactured in parallel in separate production lines.

Therefore, it is not necessary to perform a step for forming the insulating layer on the whole of the upper surface side of the wiring board 5 by heat treatment. Accordingly, occurrence of warping in the wiring board 5 can be avoided.

In addition, a manufacturing process between the wiring board 5 and the electronic component module 6 can be divided. Accordingly, the manufacturing yield can be improved more greatly than a method for building the respective elements on the wiring board.

Next, the method for connecting the electronic component module 6 in FIG. 13 to the aforementioned wiring board 5 in FIG. 7 to manufacture the electronic component device will be described. In the embodiment, a tip sealing technique for connecting the electronic component module 6 through a sealing resin material is used.

Figure 14:
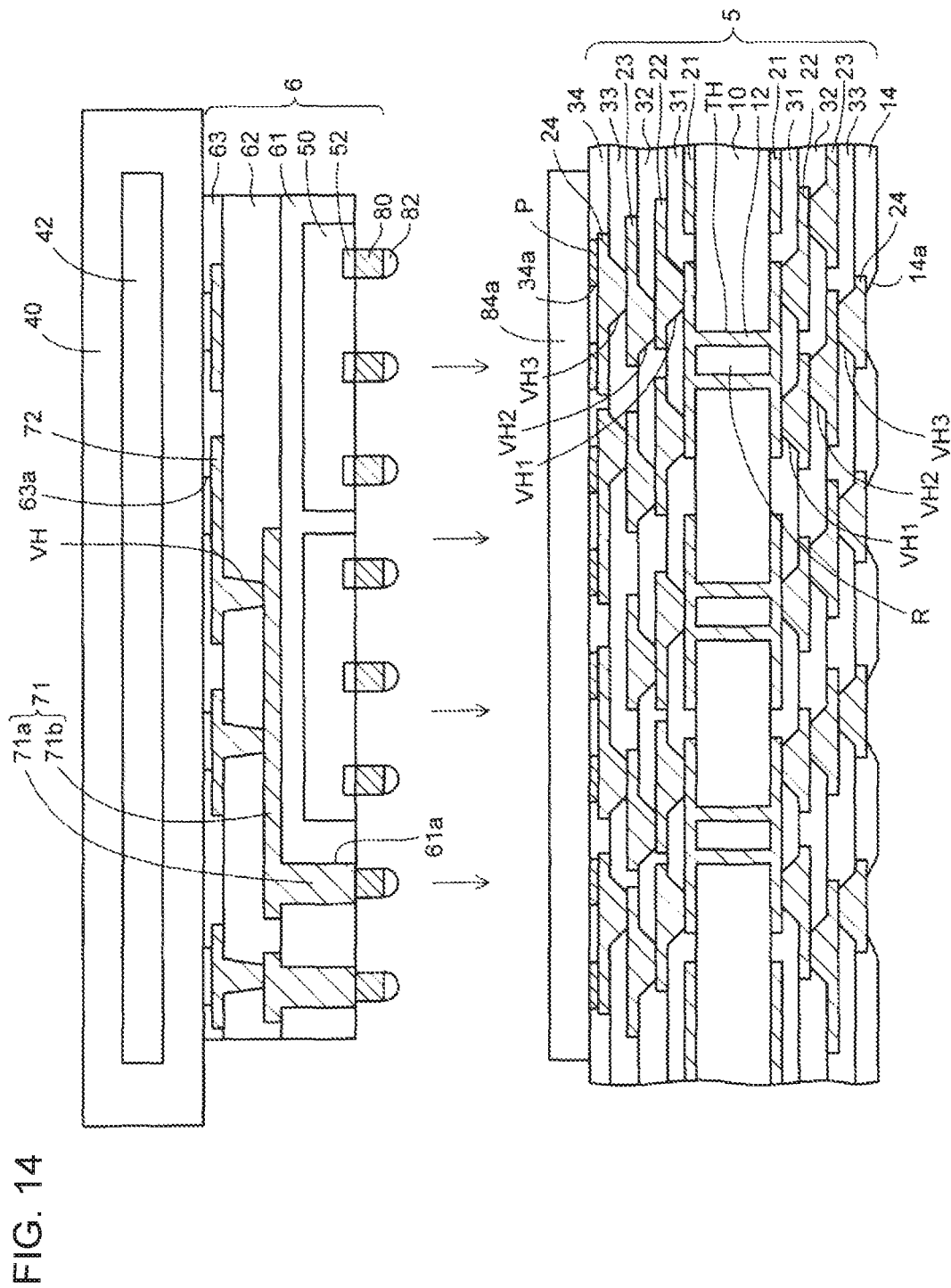
FIG. 14 is a sectional view (part 8) showing the method for manufacturing the electronic component device according to the first embodiment.
Figure 15:
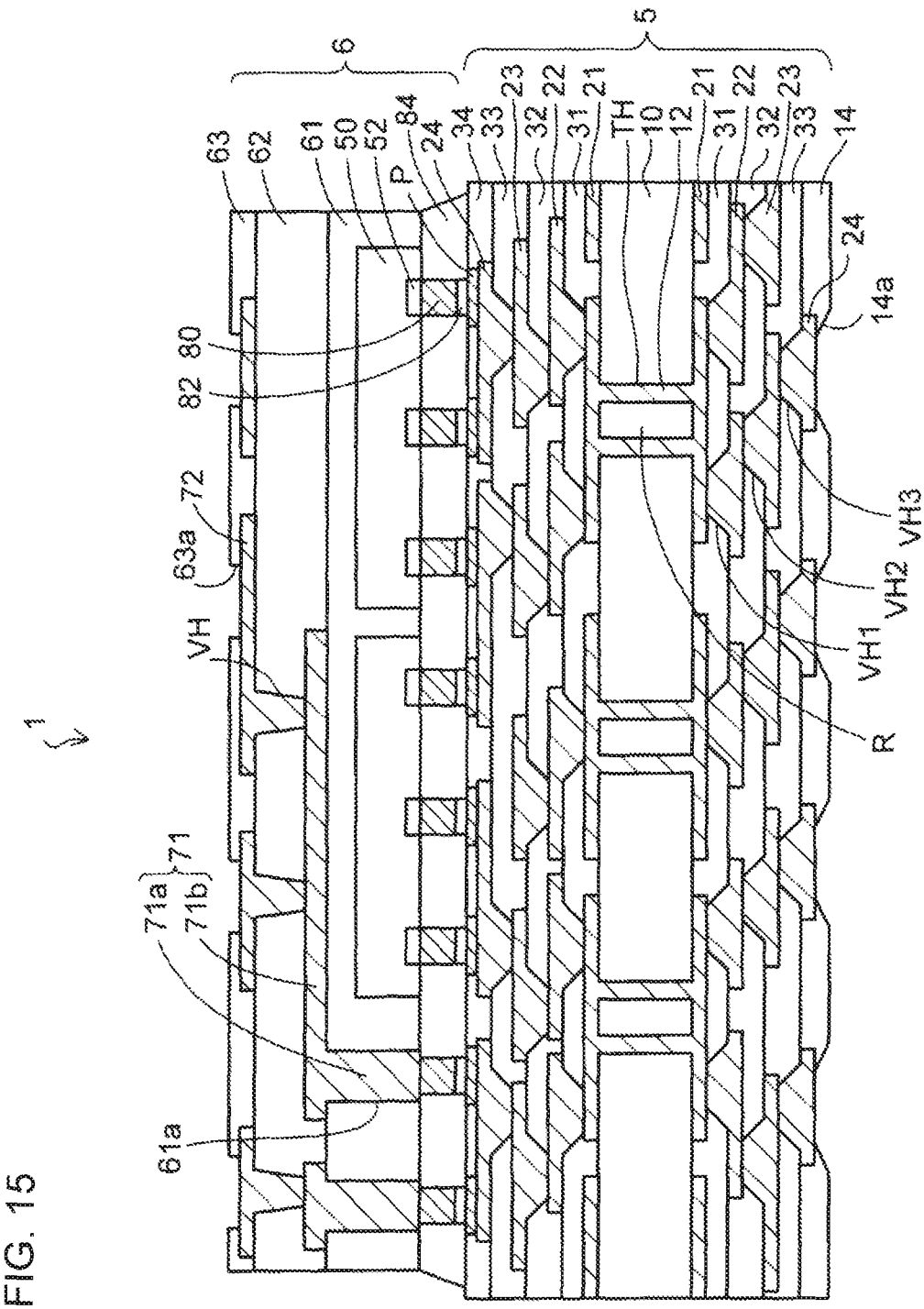
FIG. 15 is a sectional view showing the electronic component device according to the first embodiment.

As shown in FIG. 14, the aforementioned wiring board 5 in FIG. 7 is prepared and a sealing resin material 84*a* is disposed on the wiring board 5. As the sealing resin material 84*a*, an epoxy resin etc. may be used in the form of a semi-cured (B stage) resin film to be disposed or in the form of a liquid resin to be applied.

In the example of FIG. 14, the respective sealing resin materials 84*a* are divided and disposed in the respective component mounting regions A (FIG. 7) of the wiring board 5. However, the sealing resin material 84*a* may be disposed on the whole of the wiring board 5.

Successively, as shown in FIG. 14, the aforementioned electronic component module 6 in FIG. 13 is likewise prepared. The area of each component mounting region A (FIG. 7) of the wiring board 5 corresponds to the size of the electronic component module 6.

As shown in FIG. 14, the upper surface of the electronic component module 6 is likewise sucked by a bonding tool 40 provided with a heating unit 42. The heating unit 42 of the bonding tool 40 is comprised of a heating resistor or an infrared lamp, etc.

As shown in FIG. 14 and FIG. 15, the connection terminals 80 of the electronic component module 6 are pushed into the sealing resin material 84*a* on the wiring board 5. In this manner, the solders 82 at the front ends of the connection terminals 80 of the electronic component module 6 are pressed against the pads P of the wiring board 5. In FIG. 15, the bonding tool 40 will be omitted.

The pads P of the wiring board 5 are arrayed to correspond to the connection terminals 80 of the electronic component module 6 respectively.

Further, the solders 82 at the front ends of the connection terminals 80 of the electronic component module 6 are melted by Fellow heating by the heating unit 42 (FIG. 14) of the bonding tool 40 so that the connection terminals 80 of the electronic component module 6 are flip-chip connected to the pads P of the wiring board 5 by the solders 82.

For example, lead-free solders such as tin/silver-based solders or tin/silver/copper-based solders etc. are used as the solders 82 and the reflow temperature is set at about 260° C.

During the reflow heating, the sealing resin material 84*a* in a semi-cured state is simultaneously cured so that a cured sealing resin 84 can be filled on the lower side of the electronic component module 6. The sealing resin 84 is also referred to as underfill resin.

In this manner, an electronic component device 1 according to the embodiment is manufactured as shown in FIG. 15. In order to obtain the respective component mounting regions A of the wiring board 5 for obtaining multiple boards, the wiring board 5 is cut so that individual electronic component devices 1 can be obtained.

For connecting the electronic component module 6 to the wiring board 5, a partial region of the wiring board 5 is simply required to be heated by the heating unit 42 of the bonding tool 40 through the electronic component module 6.

Since the electronic component module 6 is connected to the wiring board 5, an insulating layer in which the semiconductor chips 50 can be embedded is not necessarily formed on the wiring board 5. Accordingly, it is not necessary to perform a step in which warping may occur in the wiring board 5.

Thus, large thermal stress does not occur in the wiring board 5. As a result of this, occurrence of warping in the wiring board 5 can be prevented. Therefore, an electronic component module 6 can be connected to each component mounting region A (FIG. 7) of the wiring board 5 highly reliably.

In this manner, the electronic component module 6 in a state in which the semiconductor chips 50 are embedded in the insulating base material 7 is connected to the wiring board 5. Accordingly, occurrence of warping in the wiring board 5 can be prevented and the electronic component device 1 can be manufactured with a good yield.

In the electronic component device 1 according to the first embodiment as shown in FIG. 15, the connection terminals 80 of the electronic component module 6 in FIG. 14 are connected to the pads P of the aforementioned wiring board 5 in FIG. 7 through the solders 82.

The pads P of the wiring board 5 are connected to the electronic components 50 inside the electronic component module 6 and electrically connected to the first and second wiring layers 71 and 72. In addition, the sealing resin 84 is filled into a gap between the electronic component module 6 and the wiring board 5.

The sealing resin 84 is formed not only on the lower sides of the semiconductor chips 50 but also on the whole of the lower surface of the electronic component module 6.

Figure 16:
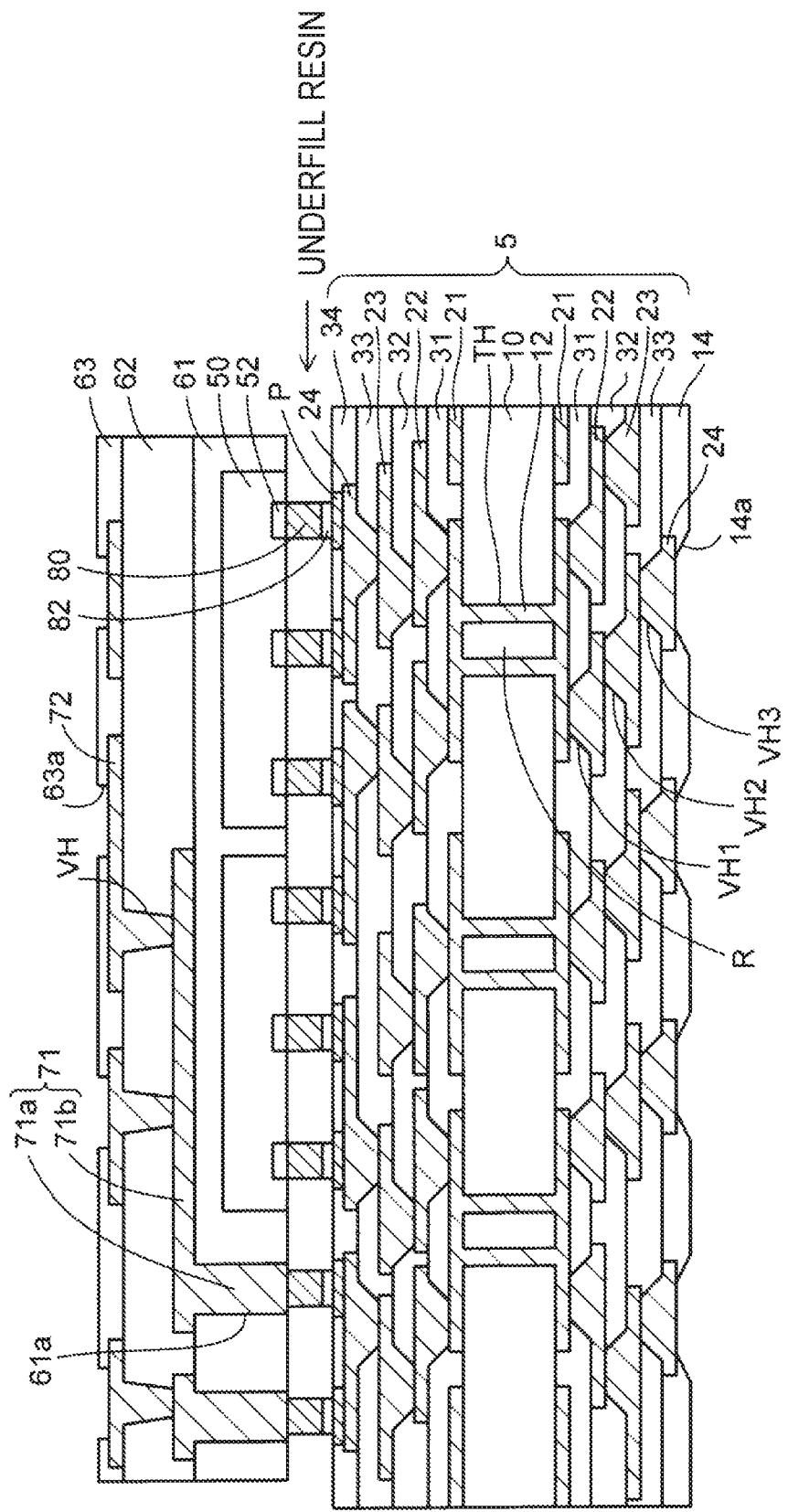
FIG. 16 is a sectional view showing a method for manufacturing an electronic component device according to a modification of the first embodiment.

A method for manufacturing an electronic component device according to a modification of the first embodiment is shown in FIG. 16. In the aforementioned FIGS. 14 and 15, the tip sealing technique is used to fill the sealing resin 84 on the lower side of the electronic component module 6.

As in the modification of FIG. 16, an underfill resin ay b filled into a gap on a lower side of an electronic component module 6 to form a sealing resin, after connection terminals 80 of the electronic component module 6 are connected to pads P of a wiring board 5 not through a sealing resin material.

Also in this case, the same structure as that of the electronic component device 1 in FIG. 15 can be obtained. Thus, the sealing resin is filled not only on the lower sides of the semiconductor chips 50 but also on the whole of the lower surface of the electronic component module 6.

In the aforementioned embodiment, each semiconductor chip 50 is illustrated as an example of an electronic component built in the electronic component module 6. In addition thereto, various electronic components such as a capacitor element, an inductor element and a resistor element may be used singly or in combination.

Second Embodiment

Figure 17:
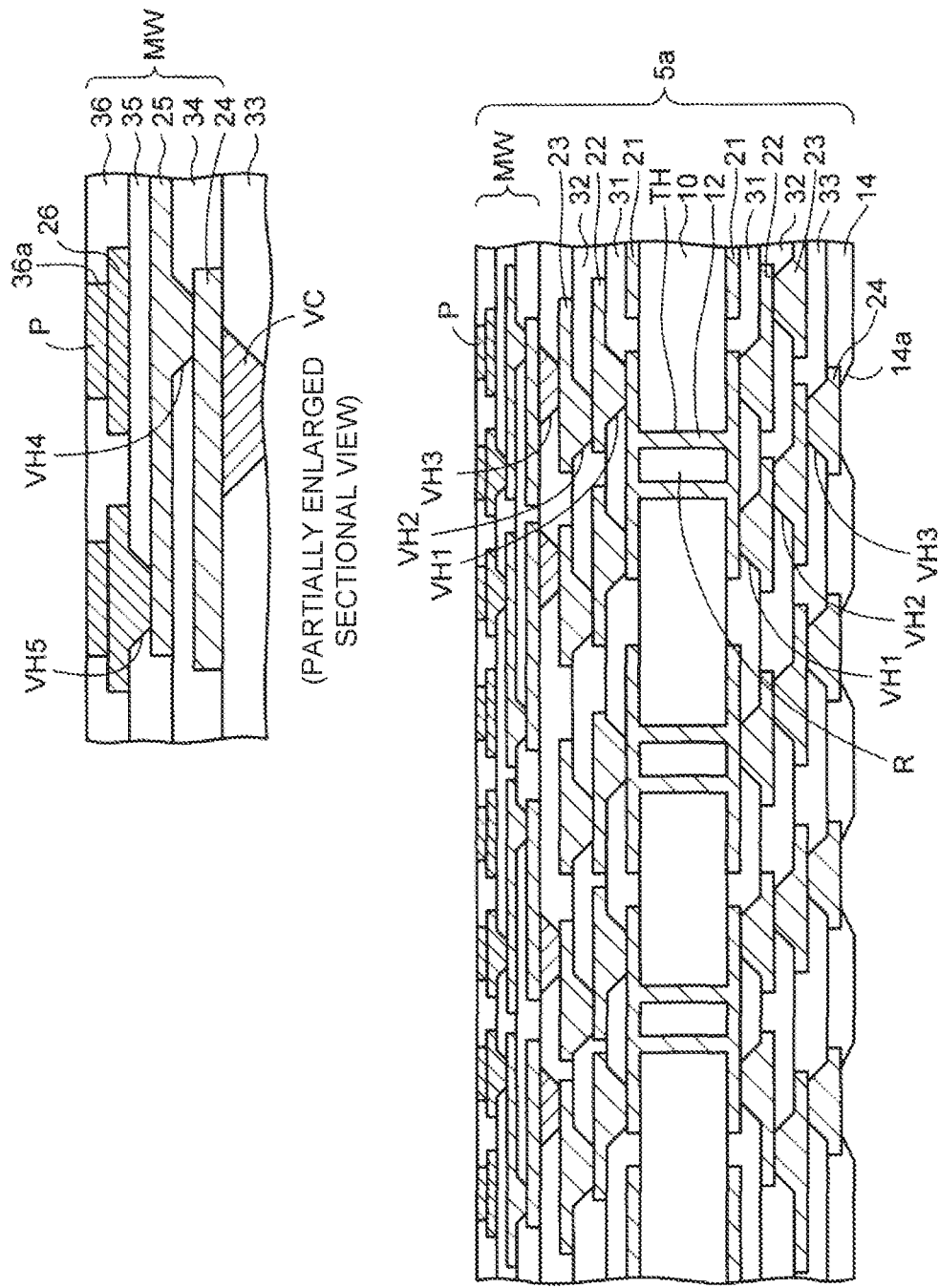
FIG. 17 is a sectional view (part 1) showing a method for manufacturing an electronic component device according to a second embodiment.
Figure 18:
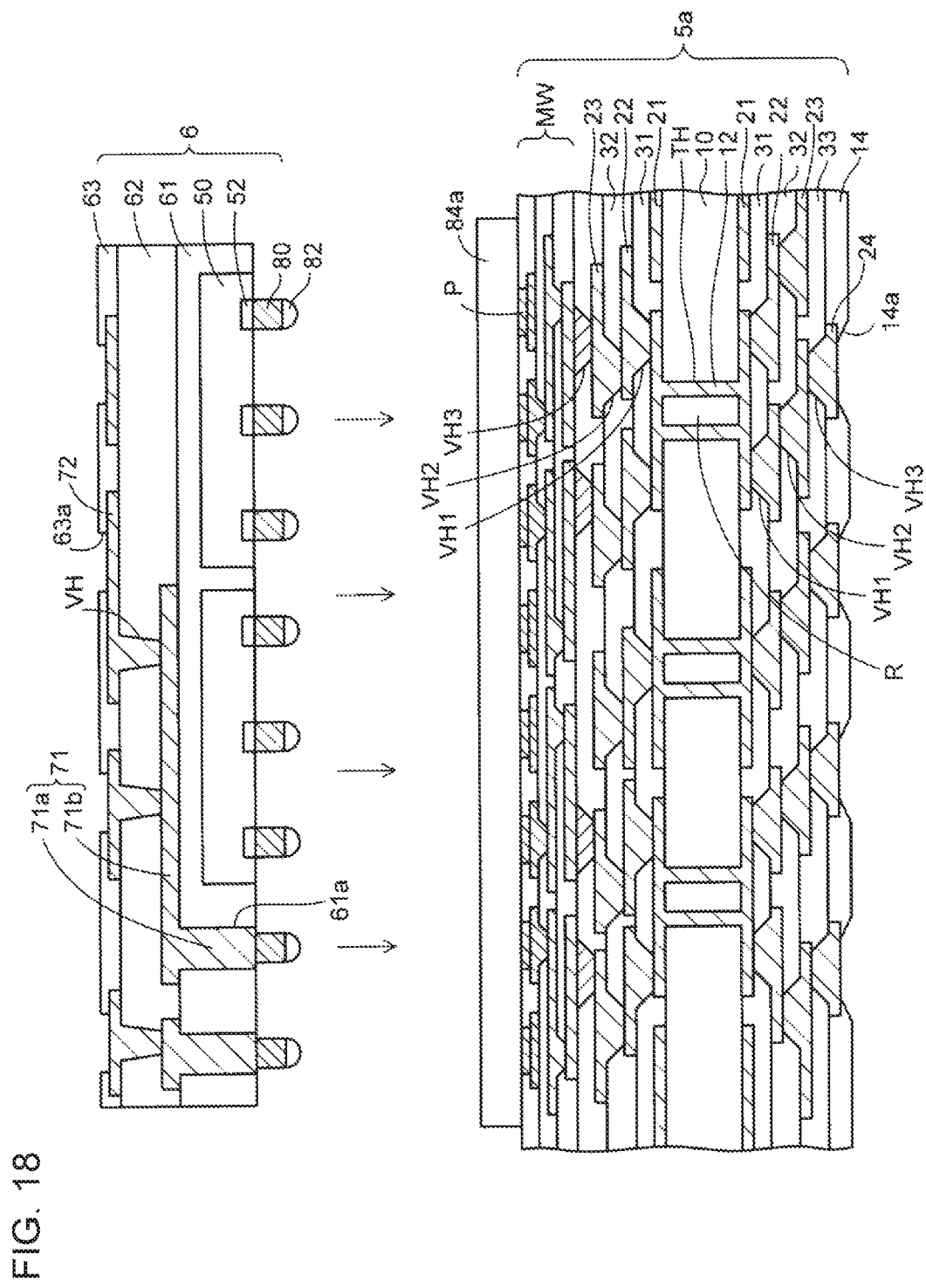
FIG. 18 is a sectional view (part 2) showing the method for manufacturing the electronic component device according to the second embodiment.
Figure 19:
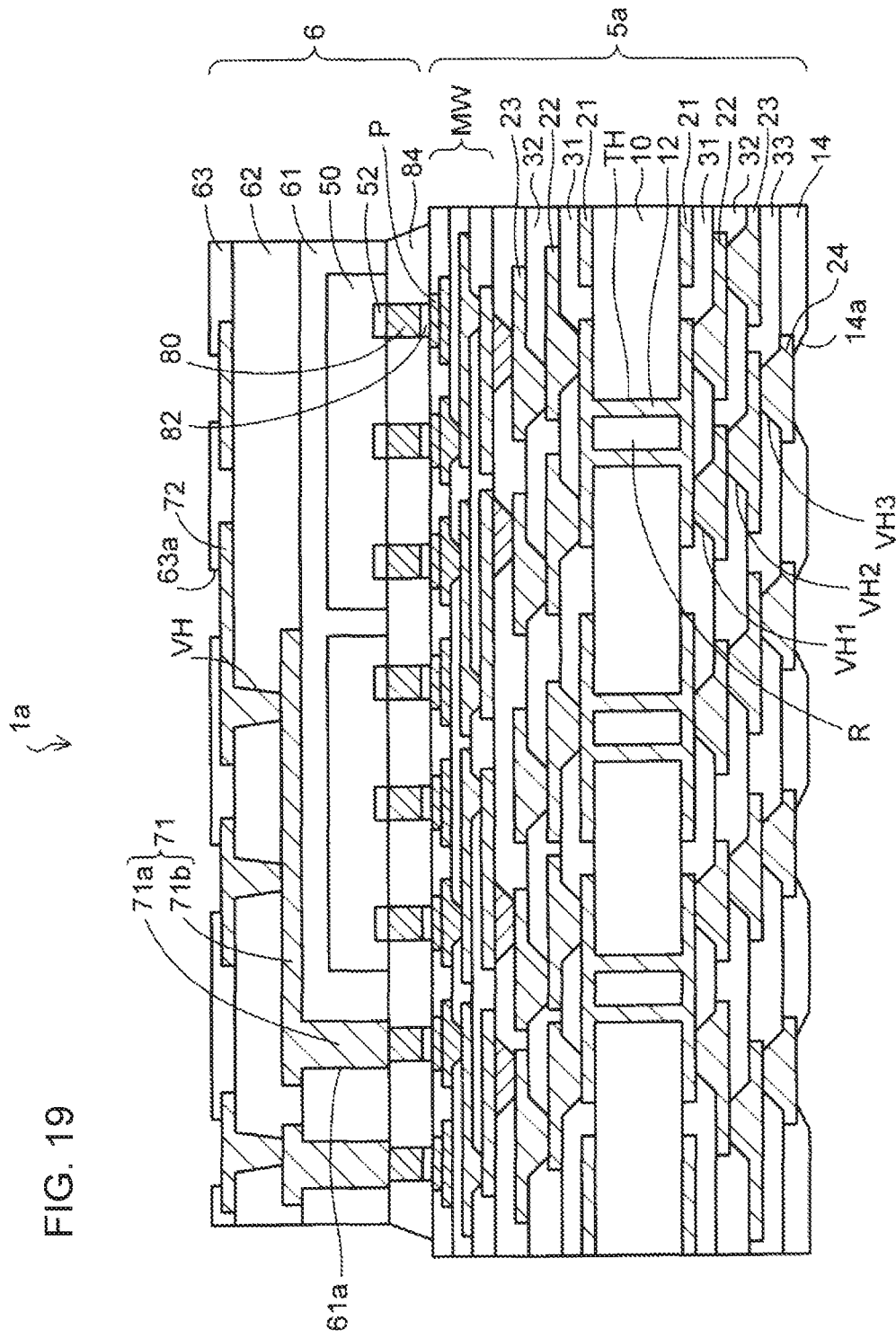
FIG. 19 is a sectional view showing the electronic component device according to the second embodiment.

FIGS. 17 and 18 are views showing a method for manufacturing an electronic component device according to a second embodiment. FIG. 19 is a view showing the electronic component device according to the second embodiment.

As shown in FIG. 17, a wiring board 5a used in the electronic component device according to the second embodiment is formed in such a manner that a micro wiring portion MW is added on the aforementioned wiring board 5 in FIG. 7 according to the first embodiment.

When a partially enlarged sectional view in FIG. 17 is additionally referred to, upper surfaces of via conductors VC under a fourth wiring layer 34 on an upper surface side and an upper surface of a third insulating layer 33 laid by the sides of the via conductors VC in the wiring board 5a used in the second embodiment are flattened by polishing based on CMP.

The micro wiring portion MW is formed on the flattened via conductors VC and the flattened third insulating layer 33. The micro wiring portion MW is formed to include a fourth wiring layer 24, a fifth wiring layer 25 and a sixth wiring layer 26.

Since the upper surface of the third insulating layer 33 is flattened, a micro resist layer can be patterned accurately within the board even if the depth of focus of photolithography for forming a micro pattern is lowered.

Therefore, the fourth wiring layer 24 which is fine, for example, with a line (width) of 2 µm and a space (interval) of 2 µm can be formed on the third insulating layer 23 by a semi-additive method.

On the other hand, first, second and third wiring layers 21, 22 and 23 of the wiring board 5a are affected by irregularities of the substrate. Accordingly, the first, second and third wiring layers 21, 22 and 23 of the wiring board 5a are set, for example, to have a line (width) of 20 µm and a space (interval) of 20 µm or more.

The fourth insulating layer 34 in which fourth via holes VH4 are disposed on connection portions of the fourth wiring layer 24 is formed on the third insulating layer 33. In addition, the fifth wiring layer 25 is formed on the fourth insulating layer 34 so that the fifth wiring layer 25 can be connected to the fourth wiring layer 24 through via conductors inside the fourth via holes VH4.

Further similarly, a fifth insulating layer 35 in which fifth via holes VH5 are disposed on connection portions of the fifth wiring layer 25 is formed on the fourth insulating lay 34.

Similarly, a sixth wiring layer 26 is formed on the fifth insulating layer 35 so that the sixth wiring layer 26 can be connected to the fifth wring layer 25 through via conductors inside the fifth via holes VH5.

A sixth insulating layer 36 in which opening portions 36a are disposed on connection portions of the fifth wiring layer 25 is formed on the fifth insulating layer 35. Pads P are disposed in the opening portions 36a of the sixth insulating layer 36.

Similar micro wiring to that of the aforementioned fourth wiring layer 24 is formed also in the fifth and sixth wiring layers 25 and 26.

In addition, a photosensitive resin layer is exposed and developed based on photolithography to thereby form each of the fourth, fifth and sixth insulating layers 34, 35 and 36. The diameter of each of the fourth and fifth via holes VH4 and VH5 is, for example, about 20 µm.

On the other hand, each of first, second and third insulating layers 31, 32, 33 of the wiring board 5a is made of a non-photosensitive resin. First, second and third via holes VH1, VH2 and VH3 are formed by a laser. The diameter of each of the first, second and third via holes VH1, VH2 and VH3 is set, for example, at about 50 µm.

Next, the same electronic component module 6 as the aforementioned one shown in FIG. 13 according to the first embodiment is prepared as shown in FIG. 18. Successively, as shown in FIGS. 18 and 19, a sealing resin material 84a is first disposed on the wiring hoard 5a in a similar manner to the step in FIGS. 14 and 15 in the first embodiment. Successively, connection terminals 80 of the electronic component module 6 sucked by a bonding tool (not shown) are brought into abutment against the pads P of the wiring board 5a through the sealing resin material 84a.

Further, by reflow heating by the bonding tool, the connection terminals 80 of the electronic component module 6 are connected to the pads P of the wiring board 5a through solders 82. In this manner, a sealing resin 84 is formed between the wiring board 5a and the electronic component module 6.

In this manner, an electronic component device 1a according to the second embodiment is manufactured.

As described above, the connection terminals 80 of the electronic component module 6 in FIG. 13 are connected to the pads P of the wiring board 5a including the aforementioned micro wiring portion MW in FIG. 17 through the solders 82 in the electronic component device 1a according to the second embodiment, as shown in FIG. 19. A gap between the electronic component module 6 and the wiring board 5a is filled with the sealing resin 84.

Similarly to the first embodiment, the sealing resin 84 is formed not only on lower sides of the semiconductor chips 50 but also on the whole of a lower surface of the electronic component module 6.

Therefore, the fourth, fifth and sixth insulating layers 34, 35 and 36 of the micro wiring portion MW of the wiring board 5a can be separated entirely and completely from the first insulating layer 61 of the electronic component module 6 by the sealing resin 84. That is, there is no region where the fourth, fifth and sixth insulating layers 34, 35 and 36 of the micro wiring portion MW are in direct contact with the first insulating layer 61 of the electronic component module 6.

The fourth, fifth and sixth insulating layers 34, 35 and 36 of the micro wiring portion MW are made of thin photosensitive resin layers in order to form micro via holes. There is a case where a filler may be mixed in some degree into each of the fourth, fifth and sixth insulating layers 34, 35 and 36 of the micro wiring portion MW for the purpose of reduction of the coefficient of expansion and improvement of roughing properties, etc.

From such a viewpoint, a content rate of a filler contained in each of the fourth, fifth and sixth insulating layers 34, 35 and 36 of the micro wiring portion MW is set in the range of from 0% to 10%, for example, set at 5%. When the content rate of a filler is too rich in the photosensitive resin layer, transparency during exposure is impeded. Therefore, the content rate of a filler has to be suppressed to be low.

Powder made of silica, alumina, boron nitride or aluminum nitride, etc. can be used as the filler.

In addition, the sealing resin 84 filled into the gap between the electronic component module 6 and the wiring board 5a is formed in order to absorb a difference in coefficient of thermal expansion between each semiconductor chip 50 and the wiring board 5a. Therefore, the content rate of the tiller contained in the sealing resin 84 is in the range of from 50% to 70%, for example, set at 60%.

In addition, the first insulating layer 61 sealing the semiconductor chips 50 of the electronic component module 6 is made of a non-photosensitive resin in which vias are formed by a laser. There is a case where a filler may be mixed in some degree into the first insulating layer 61 in order to reduce the coefficient of expansion and improvement of roughing properties, etc.

From such a viewpoint, the content rate of the filler contained in the first insulating layer 61 of the electronic component module 6 is in the range of from 0% to 40%, for example, set at 30%, Since the via holes are formed by the laser, the content rate of the filler contained in the first insulating layer 61 of the electronic component module 6 is set to be higher than that of a photosensitive resin.

As described above, in the electronic component device 1a according to the embodiment, the sealing resin 84 is disposed on the whole of the lower surface of the electronic component module 6. Further, the content rate of the filler contained in the sealing resin 84 is set to b higher than that of the filler contained in each of the fourth, fifth and sixth insulating layers 34, 35, and 36 of the wiring board 5a.

Further, the content rate of the filler contained in the sealing resin 84 is set to be higher than that of the filler contained in the first insulating layer 61 in which the semiconductor chips 50 of the electronic component module 6 are embedded.

In addition, the content rate of the filler contained in the first insulating layer 61 in which the semiconductor chips 50 of the electronic component module 6 are embedded is set to be higher than that of the filler contained in each of the fourth, fifth and sixth insulating layers 34, 35 and 36 of the wiring board 5a.

Thus, even in the case where a difference in coefficient of thermal expansion occurs between each of the fourth, fifth and sixth insulating layers 34, 35 and 36 of the wiring board 5a and the first insulating layer 61 of the electronic component module 6 due to a difference in filler content therebetween, the fourth, fifth and sixth insulating layers 34, 35 and 36 do not come into direct contact with but can be completely separated from the first insulating layer 61 by the sealing resin 84.

Differently from the embodiment, in the structure in which the sealing resin is formed only on the lower sides of the semiconductor chips 50 as in FIG. 6 according to the aforementioned preliminary matter, there appears a place where three kinds of insulating layers different in coefficient of thermal expansion make contact with one another. The three kinds of insulating layers different in coefficient of thermal expansion are the sixth insulating layer 36 of the wiring board 5a, the first insulating layer 61 of the electronic component module 6, and the sealing resin 84.

Therefore, when thermal stress occurs, there is a likelihood that cracks may occur from the place where the three kinds of insulating layers make contact with one another.

However, in the embodiment, the sixth insulating layer 36 of the wiring board 5a and the first insulating layer 61 of the electronic component module 6 can be separated from each other by the sealing resin 84. Accordingly, the place where the three kinds of insulating layers different in coefficient of thermal expansion make contact with one another is eliminated.

Therefore, in the structure, cracks hardly occur in the insulating layer so that reliability in connection between the wiring board 5a and the electronic component module 6 can be improved.

In this manner, occurrence of warping in the wiring board of the electronic component device can be prevented and electric reliability of the electronic component device can be secured.

As described above, the exemplary embodiment and the modification are described in detail. However, the present invention is not limited to the above-described embodiment and the modification, and various modifications and replacements are applied to the above-described embodiment and the modifications without departing from the scope of claims.

Various aspects of the subject matter described herein are set out non-exhaustively in the following numbered clauses:

1) A method for manufacturing an electronic component device comprising:

a) preparing a wiring board comprising an insulating layer and a plurality of pads exposed from the insulating layer;

b) preparing an electronic component module comprising an insulating base material, an electronic component embedded in the insulating base material, and a plurality of connection terminals; and c) providing a sealing resin material on the wiring board and connecting each of the plurality of connection terminals to a corresponding one of the plurality of pads through the sealing resin material.

2) A method for manufacturing an electronic component device comprising:

a) preparing a wiring board comprising an insulating layer and a plurality of pads exposed from the insulating layer;

b) preparing an electronic component module comprising an insulating base material, an electronic component bedded in the insulating base material, and a plurality of connection terminals;

c) connecting each of the plurality of connection terminals to a corresponding one of the plurality of pads; and d) filling a sealing resin into a gap between the whole of a lower surface of the electronic component module and the wiring board.

3) The method according to clause (1) or (2), wherein the step (b) comprises:

b-1) temporarily bonding the electronic component on a support plate such that an electrode of the electronic component faces the support plate;

b-2) forming an insulating layer having an opening portion on the support plate such that the electronic component is embedded in the insulating layer and the opening portion is formed in a region outside the electronic component;

b-3) forming a wiring layer comprising a wiring portion formed on the insulating layer, and a columnar conductor which is connected to the wiring portion and embedded in the opening portion;

b-4) removing the support plate; and b-5) forming a plurality of connection terminals, wherein at least one of the plurality of connection terminals is electrically connected to the electrode of the electronic component, and at least one of the plurality of connection terminals is electrically connected to the columnar conductor.

4) The method according to clause (1) or (2), wherein a content rate of filler contained in the sealing resin is higher than that of filler contained in the insulating layer and that of filler contained in the insulating base material.

5) The method according to clause (1) or (2), wherein the content rate of the filler contained in the insulating base material is higher than that of the filler contained in the insulating layer.

6) The method according to clause (1) or (2), wherein the insulating base material is made of a non-photosensitive resin, and the insulating layer is made of a photosensitive resin.

What is claimed is:

1. An electronic component device comprising:
   a wiring board comprising:
      a core substrate having a first surface and a second surface;
      a first multilayer wiring layer disposed on the first surface of the core substrate, the first multilayer wiring layer comprising an insulating layer and a plurality of pads exposed from the insulating layer;
      a second multilayer wiring layer disposed on the second surface of the core substrate;
   an electronic component module comprising:
      an insulating base material comprising a first insulating base material layer and a second insulating base material layer, wherein the second insulating base material layer is disposed on a first surface of the first insulating base material layer with a second surface of the second insulating base material layer facing the first surface of the first insulating base material layer, a first surface of the second insulating base material layer is opposite to the second surface of the second insulating base material layer, and a second surface of the first insulating base material layer is opposite to the first surface of the first insulating base material layer and defines a surface of the electronic component module;
      an electronic component embedded in the first insulating base material layer of the insulating base material, wherein an electrode of the electronic component is exposed from the second surface of the first insulating base material layer, and the first insulating base material layer has an opening portion which is formed in a region outside the electronic component;
      a wiring layer comprising a wiring portion formed on the first surface of the first insulating base material layer and a second wiring layer disposed on the first surface of the second insulating base material layer;
      a columnar conductor which is connected to the wiring portion and embedded in the opening portion;
      a plurality of connection terminals each connected to a corresponding one of the pads, wherein at least one of the plurality of connection terminals is electrically connected to the electrode of the electronic component, and at least one of the plurality of connection terminals is electrically connected to the columnar conductor;
      a solder resist layer formed on the first surface of the second insulating base material layer, the solder resist layer having a solder resist layer opening portion defined therethrough, the solder resist layer opening portion exposing a portion of the second wiring layer from the solder resist layer; and
   a sealing resin provided between the insulating base material of the electronic component module and the wiring board such that an entirety of the insulating base material of the electronic component module is spaced from the insulating layer of the wiring board with the sealing resin disposed therebetween,
   wherein a content rate of filler contained in the sealing resin is higher than that of filler contained in the insulating layer and that of filler contained in the insulating base material wherein a content rate of electrically nonconductive filler contained in the sealing resin is higher than that of electrically nonconductive filler contained in the insulating layer and that of electrically nonconductive tiller contained in the insulating base material; and
   wherein the content rate of electrically nonconductive filler contained in the insulating layer and the content rate of electrically nonconductive filler contained in the insulating base material are greater than zero.

2. The electronic component device according to claim 1, wherein the electrically nonconductive content rate of the filler contained in the insulating base material is higher than that of the electrically nonconductive filler contained in the insulating layer.

3. The electronic component device according to claim 1, wherein
   the insulating base material is made of a non-photosensitive resin, and
   the insulating layer is made of a photosensitive resin.

4. The electronic component device according to claim 1, wherein the sealing resin directly contacts both the insulating layer and the insulating layer base material, and the insulating layer and the insulating layer base material do not contact each other.

* * * * *